United States Patent
Yang et al.

(10) Patent No.: US 10,128,259 B1
(45) Date of Patent: Nov. 13, 2018

(54) METHOD FOR MANUFACTURING EMBEDDED MEMORY USING HIGH-K-METAL-GATE (HKMG) TECHNOLOGY

(71) Applicant: Taiwan Semiconductor Manufacturing Co., Ltd., Hsin-Chu (TW)

(72) Inventors: Tsung-Yu Yang, Tainan (TW); Chung-Jen Huang, Tainan (TW); Yun-Chi Wu, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/651,403

(22) Filed: Jul. 17, 2017

(51) Int. Cl.

| | |
|---|---|
| *H01L 29/792* | (2006.01) |
| *H01L 27/11568* | (2017.01) |
| *H01L 27/11521* | (2017.01) |
| *H01L 27/11526* | (2017.01) |
| *H01L 27/11573* | (2017.01) |
| *H01L 29/423* | (2006.01) |
| *H01L 21/027* | (2006.01) |
| *H01L 21/311* | (2006.01) |
| *H01L 21/3105* | (2006.01) |

(52) U.S. Cl.
CPC .... *H01L 27/11568* (2013.01); *H01L 21/0276* (2013.01); *H01L 21/31053* (2013.01); *H01L 21/31111* (2013.01); *H01L 21/31144* (2013.01); *H01L 27/11521* (2013.01); *H01L 27/11526* (2013.01); *H01L 27/11573* (2013.01); *H01L 29/42328* (2013.01); *H01L 29/42344* (2013.01)

(58) Field of Classification Search
USPC ...... 257/314–326, E27.078, E29.3–E29.309, 257/255–266
See application file for complete search history.

(56) References Cited

U.S. PATENT DOCUMENTS

| 7,563,675 B2 | 7/2009 | Liu et al. | |
|---|---|---|---|
| 2008/0157185 A1* | 7/2008 | Joo | H01L 21/28282 257/324 |
| 2009/0309150 A1* | 12/2009 | Power | H01L 21/28273 257/316 |
| 2013/0207174 A1* | 8/2013 | Wang | H01L 21/28273 257/316 |

(Continued)

*Primary Examiner* — Tram H Nguyen
(74) *Attorney, Agent, or Firm* — Eschweiler & Potashnik, LLC

(57) ABSTRACT

A method for manufacturing embedded memory using high-κ-metal-gate (HKMG) technology is provided. A gate stack is formed on a semiconductor substrate. The gate stack comprises a charge storage film and a control gate overlying the charge storage film. The control gate includes a first material. A gate layer is formed of the first material, and is formed covering the semiconductor substrate and the gate stack. The gate layer is recessed to below a top surface of the gate stack, and subsequently patterned to form a select gate bordering the control gate and to form a logic gate spaced from the select and control gates. An ILD layer is formed between the control, select, and logic gates, and with a top surface that is even with top surfaces of the control, select, and logic gates. The control, select, or logic gate is replaced with a new gate of a second material.

20 Claims, 28 Drawing Sheets

(56) References Cited

U.S. PATENT DOCUMENTS

| | | | |
|---|---|---|---|
| 2015/0263010 A1* | 9/2015 | Chuang | H01L 29/66545 257/319 |
| 2016/0148944 A1* | 5/2016 | Yu | H01L 27/11536 438/258 |

* cited by examiner

METHOD FOR MANUFACTURING EMBEDDED MEMORY USING HIGH-K-METAL-GATE (HKMG) TECHNOLOGY

BACKGROUND

Embedded memory is electronic memory that is integrated with logic devices on a common integrated circuit (IC) die or chip. The embedded memory supports operation of the logic devices and is often used with very-large-scale integration (VLSI) IC dies or chips. The integration advantageously improves performance by eliminating interconnect structures between chips and advantageously reduces manufacturing costs by sharing process steps between the embedded memory and the logic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
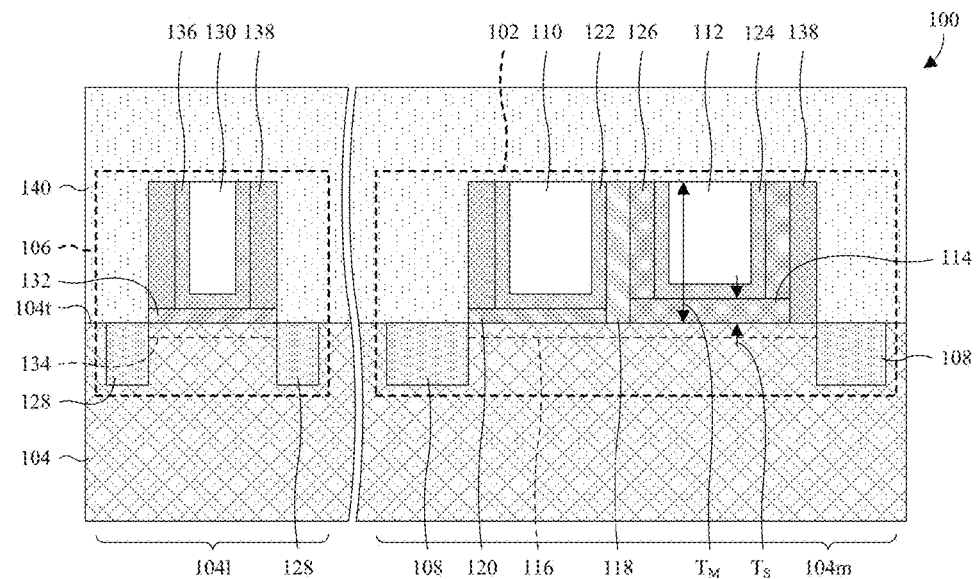
FIG. 1 illustrates a cross-sectional view of some embodiments of an integrated circuit (IC) using high-κ-metal-gate (HKMG) technology and comprising an embedded memory cell.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an etch, a dielectric layer, or a substrate) may be referred to as a "first" element in some embodiments, the element may be referred to as a "second" element in other embodiments.

Some integrated circuits (ICs) comprise a logic device and an embedded memory cell on a common semiconductor substrate. The logic device comprises a first pair of source/drain regions and a logic gate between the source/drain regions of the first pair. The embedded memory cell is spaced from the logic device, and comprises a second pair of source/drain region regions, an erase gate, a word line, and a gate stack. The erase gate overlies a source/drain region of the second pair, and the gate stack and the word line are spaced between the source/drain regions of the second pair, such that the word line borders the control gate. The gate stack comprises a floating gate and a control gate overlying the floating gate.

The logic gate, the control gate, the word line, the erase gate, and the floating gate are typically polysilicon. However, semiconductor devices using polysilicon gates are reaching performance and/or scaling limits. Therefore, high-κ-metal-gate (HKMG) technology is increasingly being used for at least the logic device. Methods for manufacturing the logic device using HKMG technology typically comprise forming the logic device with a dummy logic gate, and forming an interlayer dielectric (ILD) layer covering the logic device. Subsequently, a planarization is performed into the ILD layer to expose a top surface of the dummy logic gate, and the dummy logic gate is replaced with a high κ dielectric layer and a metal logic gate overlying the high κ dielectric layer.

A challenge with the foregoing methods is that the embedded memory cell is typically formed with the logic device. Further, a bottom surface of the control gate typically has minimal spacing from a top surface of the logic gate since the control gate is formed on the floating gate and the floating gate has a thickness comparable to that of the dummy logic gate. As such, during the planarization to expose the dummy logic gate, a majority of or all of the control gate may be removed, thereby destroying the embedded memory cell. While the methods could be modified to overcome this challenge, such modifications come at the cost of increased complexity and increased cost.

In view of the foregoing, various embodiments of the present application are directed towards a method for manufacturing embedded memory using HKMG technology. In some embodiments, a gate stack is formed on a semiconductor substrate. The gate stack comprises a charge storage film (e.g., an oxide-nitride-oxide (ONO) film) and a control gate overlying the charge storage film. The control gate is a first material. A gate layer is formed covering the semiconductor substrate and the gate stack. The gate layer is the first material. A top surface of the gate layer is recessed to below a top surface of the gate stack. The gate layer is patterned to form a select gate bordering the control gate, and to further form a logic gate spaced from the select and control gates. An ILD layer is formed laterally between the control, select, and logic gates, and further with a top surface that is even with top surfaces respectively of the control, select, and logic gates. The control, select, or logic gate is replaced with a new gate, and the new gate is a second material different than the first material.

Advantageously, the charge storage film has a minimal thickness relative to the control and logic gates, and the control gate has a bottom surface that is sufficiently spaced below a top surface of the logic gate for use with HKMG replacement. This is advantageous because, during HKMG replacement, a planarization may be performed to the top surface of the logic gate. If the bottom surface of the control gate is not sufficiently spaced below the top surface of the logic gate, the control gate may be completely or almost completely removed by the planarization, whereby the control gate may be too small for use in production and/or too small for replacement with a HKMG stack. Further, by using a 1.5 transistor (1.5T) flash structure (e.g., by using a common selectively-conductive channel for the gate stack and the select gate), the embedded memory may advantageously be programmed by hot carrier injection (HCI), which is fast and has low power consumption. Further yet, by using the charge storage film stack with HKMG for data storage, the embedded memory has large program and erase windows and the process for manufacturing the embedded memory is simplified.

With reference to FIG. 1, a cross-sectional view 100 of some embodiments of an IC comprising an embedded memory cell 102 and using HKMG technology is provided. As illustrated, the embedded memory cell 102 is on a memory region 104m of a semiconductor substrate 104, laterally spaced from a logic device 106 on a logic region 104l of the semiconductor substrate 104. The embedded memory cell 102 may be, for example, a 1.5 transistor (1.5T) semiconductor-oxide-nitride-oxide-semiconductor (SONOS) memory cell, a 1.5T metal-oxide-nitride-oxide-semiconductor (MONOS) memory cell, or some other type of memory cell. The logic device 106 may be, for example, metal-oxide-semiconductor field-effect transistor (MOSFET), some other type of insulated gate field-effect transistor (IGFET), or some other type of semiconductor device.

The embedded memory cell 102 comprises a pair of memory source/drain regions 108, as well as a select gate 110, a control gate 112, and a charge storage film 114. The memory source/drain regions 108 are in the semiconductor substrate 104, along the top surface 104t of the semiconductor substrate 104, and define a selectively-conductive memory channel 116 in the semiconductor substrate 104. The selectively-conductive memory channel 116 extends along the top surface 104t of the semiconductor substrate 104, from one of the memory source/drain regions 108 to another one of the memory source/drain regions 108.

The select gate 110 and the charge storage film 114 are spaced between the memory source/drain regions 108, and the control gate 112 overlies the charge storage film 114. The charge storage film 114 may be, for example, an ONO film (e.g., a pair of oxide layers and a nitride layer sandwiched between the oxide layers), an oxide-silicon nanodot-oxide film (e.g., a pair of oxide layers and a layer of silicon nanodots sandwiched between the oxide layers), or some other type of charge storage film. The select and control gates 110, 112 may be, for example, metal (e.g., aluminum copper), doped polysilicon, or some other conductive material. Further, the select gate 110 may be, for example, a word line.

In operation, the charge storage film 114 stores charge representing a bit of data, and the select gate 110, the control gate 112, and the memory source/drain regions 108 are selectively biased to program, erase, and read the bit of data.

In some embodiments, programming (e.g., setting the bit of data to a binary "0") is performed by hot carrier injection (HCI) (e.g., source-side injection (SSI)). Further, in some embodiments, erasing (e.g., setting the bit of data to a binary "1") is performed by Fowler-Nordheim tunneling (FNT). Advantageously, HCI is fast and has low power consumption. Further, by using the charge storage film 114 for data storage, the control gate 112 advantageously spans the majority of the memory cell thickness $T_M$ since the charge storage film 114 can have a minimal thickness $T_S$. As seen hereafter, this simplifies the integration of HKMG technology into methods for manufacturing the embedded memory cell 102 and the logic device 106.

An inter-gate spacer 118 is laterally between the select and control gates 110, 112 to laterally space the select gate 110 from the control gate 112 and from the charge storage film 114. A base select gate dielectric layer 120 is vertically between the select gate 110 and the semiconductor substrate 104 to vertically space the select gate 110 from the semiconductor substrate 104. The inter-gate spacer 118 and/or the base select gate dielectric layer 120 may be, for example, oxide or some other dielectric.

In some embodiments where the select gate 110 is metal, a high κ select gate dielectric layer 122 lines a bottom surface of the select gate 110, between the base select gate dielectric layer 120 and the select gate 110. Further, in some embodiments, the high κ select gate dielectric layer 122 lines the bottom surface of the select gate 110, and further lines sidewalls of the select gate 110, to cup the select gate 110. In some embodiments where the control gate 112 is metal, a high κ control gate dielectric layer 124 lines a bottom surface of the control gate 112, between the charge storage film 114 and the control gate 112. Further, in some embodiments, the high κ control gate dielectric layer 124 lines the bottom surface of the control gate 112, and further lines sidewalls of the control gate 112, to cup the control gate 112. As used herein, a high κ dielectric layer is a dielectric with a dielectric constant κ greater than about 3.9, 5, 10, 15, or 20. Advantageously, where the embedded memory cell 102 uses HKMG technology (e.g., the select gate 110 and/or the control gate 112 are metal, and the one or more metal gates overlie one or more respective high κ dielectric layers), the embedded memory cell 102 has low power consumption and high switching speed. Further, where the embedded memory cell 102 uses HKMG technology, the embedded memory cell 102 may advantageously be scaled in different process nodes, such as, for example, 10, 16, 20, and 28 nanometer process nodes.

In some embodiments, control gate sidewall spacers 126 are along sidewalls of the control gate 112 to laterally space the sidewalls respectively from neighboring sidewalls of the charge storage film 114. For example, one of the control gate sidewall spacers 126 may be along a sidewall of the control gate 112, between the sidewall and the inter-gate spacer 118. The control gate sidewall spacers 126 may be, for example, ONO films or some other dielectric materials. For ease of illustration, only one of the control gate sidewall spacers 126 is labeled 126.

The logic device 106 comprises a pair of logic source/drain regions 128, as well as a logic gate 130 and a base logic gate dielectric layer 132. The logic source/drain regions 128 are in the semiconductor substrate 104, along the top surface 104t of the semiconductor substrate 104, and define a selectively-conductive logic channel 134 in the semiconductor substrate 104. The selectively-conductive logic channel 134 extends along the top surface 104t of the semiconductor substrate 104, from one of the logic source/drain regions 128 to another one of the logic source/drain regions 128.

The logic gate 130 and the base logic gate dielectric layer 132 are between the logic source/drain regions 128, and the logic gate 130 overlies the base logic gate dielectric layer 132. The base logic gate dielectric layer 132 may be, for example, oxide or some other dielectric, and the logic gate 130 may be, for example, metal (e.g., aluminum copper), doped polysilicon, or some other conductive material. In some embodiments where the logic gate 130 is metal, a high κ logic gate dielectric layer 136 lines a bottom surface of the logic gate 130, between the base logic gate dielectric layer 132 and the logic gate 130. Further, in some embodiments, the high κ logic gate dielectric layer 136 lines the bottom surface of the logic gate 130, and further lines sidewalls of the logic gate 130, such that the high κ logic gate dielectric layer 136 cups the logic gate 130. Advantageously, where the logic device 106 uses HKMG technology (e.g., the logic gate 130 is metal and overlies the high κ logic gate dielectric layer 136), the logic device 106 has low power consumption and high switching speed. Further, the logic device 106 may advantageously be scaled in different process nodes (e.g., 10 or 16 nanometer process nodes).

In some embodiments, main sidewall spacers 138 are along sidewalls of the logic gate 130, and/or are along sidewalls of the select and control gates 110, 112. For example, a pair of main sidewall spacers may be on opposite side of the logic device 106, such that the logic gate 130 is sandwiched between the main sidewall spacers. As another example, a pair of main sidewall spacers may be on opposite sides of the embedded memory cell 102, such that the select and control gates 110, 112 are sandwiched between the main sidewall spacers. The main sidewall spacers 138 may, for example, be oxide, nitride, or some other dielectric. Further, for ease of illustration, only some of the main sidewall spacers 138 are labeled 138.

In some embodiments, an ILD layer 140 covers the embedded memory cell 102 and the logic device 106. Further, in some embodiments, contact vias (not shown) extend through the ILD layer 140 to the memory source/drain regions 108, the logic source/drain regions 128, the control gate 112, the select gate 110, the logic gate 130, or a combination of the foregoing. The ILD layer 140 may be, for example, an oxide, a low κ dielectric, or some other dielectric, and the contact vias may be, for example, tungsten, aluminum copper, copper, or some other metal or conductive material. As used herein, a low κ dielectric is a dielectric with a dielectric constant κ less than about 3.9, 3, 2, or 1.

While FIG. 1 illustrates the select, control, and logic gates 110, 112, 130 as overlying respective high κ dielectric layers, it is to be understood that at least one or all of the high κ dielectric layers (e.g., the high κ logic gate dielectric layer 136) may be omitted in some embodiments. In such embodiments, the one or more gates without high κ dielectric layers are typically polysilicon, and/or the one or more gates with high κ dielectric layers are typically metal. For example, the select and control gates 110, 112 may be polysilicon, and the logic gate 130 may be metal. Further, continuing with this example, the high κ logic gate dielectric layer 136 may underlie the logic gate 130 and the high κ select and control gate dielectric layers 122, 124 may be omitted. As another example, the select, control, and logic gates 110, 112, 130 may be metal, and the select, control, and logic gates 110, 112, 130 may respectively overlie the high κ select, control, and logic gate dielectric layers 122, 124, 136.

Figure 2:
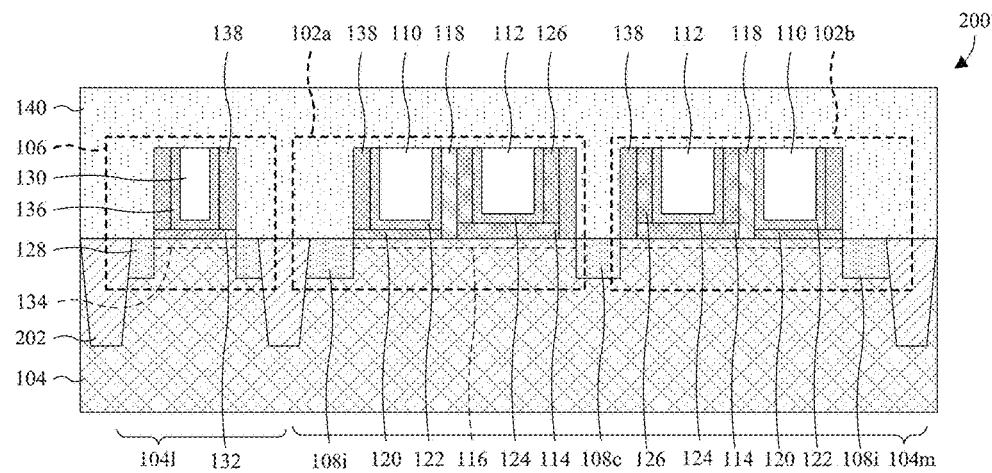
FIG. 2 illustrates a cross-sectional view of some more detailed embodiments of the IC of FIG. 1.

With reference to FIG. 2, a cross-sectional view 200 of some more detailed embodiments of the IC of FIG. 1 is provided. As illustrated, a first embedded memory cell 102a and a second embedded memory cell 102b are on the memory region 104m of the semiconductor substrate 104, laterally spaced from the logic region 104l of the semiconductor substrate 104. As in FIG. 1, the logic region 104l of the semiconductor substrate 104 supports the logic device 106. The semiconductor substrate 104 may be, for example, a bulk silicon substrate or some other type of semiconductor substrate. In some embodiments, the memory and logic regions 104m, 104l of the semiconductor substrate 104 are demarcated by an isolation structure 202 extending into the top surface of the semiconductor substrate 104. The isolation structure 202 may be, for example, a deep trench isolation structure, a shallow trench isolation structure, or some other type of isolation structure.

The first and second embedded memory cell 102a, 102b are each as the embedded memory cell 102 of FIG. 1 is described, except that the second embedded memory cell 102b is a mirror image of the embedded memory cell 102 of FIG. 1. Further, the first and second embedded memory cells 102a, 102b share a common memory source/drain region 108c and have individual memory source/drain regions 108i. The individual memory source/drain regions 108i and the common memory source/drain region 108c are in the semiconductor substrate 104, along the top surface of the semiconductor substrate 104. Further, the individual memory source/drain regions 108i and the common memory source/drain region 108c define selectively-conductive memory channels 116 in the semiconductor substrate 104. For ease of illustration, only one of the selectively-conductive memory channels 116 is labeled 116. The selectively-conductive memory channels 116 are individual to the first and second embedded memory cell 102a, 102b, and each extends from the common memory source/drain region 108c to a respective one of the individual memory source/drain regions 108i.

Figure 3:
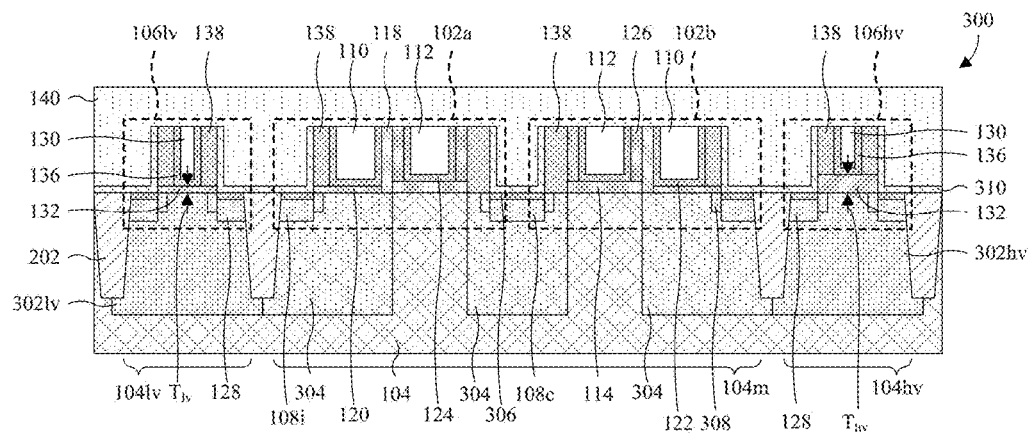
FIG. 3 illustrates a cross-sectional view of some more detailed embodiments of the IC of FIG. 2.

With reference to FIG. 3, a cross-sectional view 300 of some more detailed embodiments of the IC of FIG. 2 is provided. As illustrated, the first embedded memory cell 102a and the second embedded memory cell 102b are on the memory region 104m of the semiconductor substrate 104, laterally spaced from a low voltage logic region 104lv of the semiconductor substrate 104 and a high voltage logic region 104hv of the semiconductor substrate 104. In some embodiments, the memory region 104m of the semiconductor substrate 104 is spaced between the low and high voltage logic regions 104lv, 104hv of the semiconductor substrate 104.

In some embodiments, a low voltage well 302lv is in the low voltage logic region 104lv of the semiconductor substrate 104, and/or a high voltage well 302hv is in the high voltage logic region 104hv of the semiconductor substrate 104. Further, in some embodiments, a threshold adjustment region 304 is in the memory region 104m of the semiconductor substrate 104. The threshold adjustment region 304 is a doped region of the semiconductor substrate 104 that adjusts threshold voltages of the select gates 110.

A low voltage logic device 106lv is on the low voltage logic region 104lv of the semiconductor substrate 104, and a high voltage logic device 106hv is on the high voltage logic region 104hv of the semiconductor substrate 104. The low voltage logic device 106lv is "low" voltage in that it is limited to a smaller gate-to-source voltage and/or a smaller source-to-drain voltage than the high voltage logic device 106hv. In some embodiments, the low voltage logic device 106lv is limited to a gate-to-source voltage and/or a sourceto-drain voltage less than about 5, 10, 50, 100, or 200 volts. The low voltage logic device 106$lv$ and the high voltage logic device 106$hv$ are each as the logic device 106 of FIG. 1 is described, except that the high voltage logic device 106$hv$ has increased electrical insulation. For example, the base logic gate dielectric layer 132 of the low voltage logic device 106$lv$ has a low-voltage thickness $T_{lv}$, and the base logic gate dielectric layer 132 of the high voltage logic device 106$hv$ has a high-voltage thickness $T_{hv}$ greater than the low-voltage thickness $T_{lv}$.

Also illustrated by the cross-sectional view 300 of FIG. 3, in some embodiments, a silicide layer 306 is along a top surface of the common memory source/drain region 108$c$, the individual memory source/drain regions 108$i$, and the logic source/drain regions 128. The silicide layer 306 may be, for example, nickel silicide or some other type of silicide. Further, in some embodiments, the common memory source/drain region 108$c$, the individual memory source/drain regions 108$i$, and the logic source/drain regions 128 border respective lightly-doped drain (LDD) regions 308. For ease of illustration, only one of the LDD regions 308 is labeled 308. Further yet, in some embodiments, a contact etch stop layer 310 lines sidewalls of the main sidewall spacers 138, and further covers the silicide layer 306. The contact etch stop layer 310 may be, for example, silicon nitride, silicon oxynitride, silicon dioxide, or some other dielectric.

While FIGS. 2 and 3 illustrate the select, control, and logic gates 110, 112, 130 as overlying respective high κ dielectric layers, it is to be understood that at least one or all of the high κ dielectric layers may be omitted in some embodiments. In such embodiments, the one or more gates without high κ dielectric layers are typically polysilicon, and/or the one or more gates with high κ dielectric layers are typically metal.

With reference to FIGS. 4-19, a series of cross-sectional views 400-1900 illustrate some embodiments of a method for manufacturing an IC with embedded memory using HKMG technology. The IC may, for example, be the IC of FIG. 2.

Figure 4:
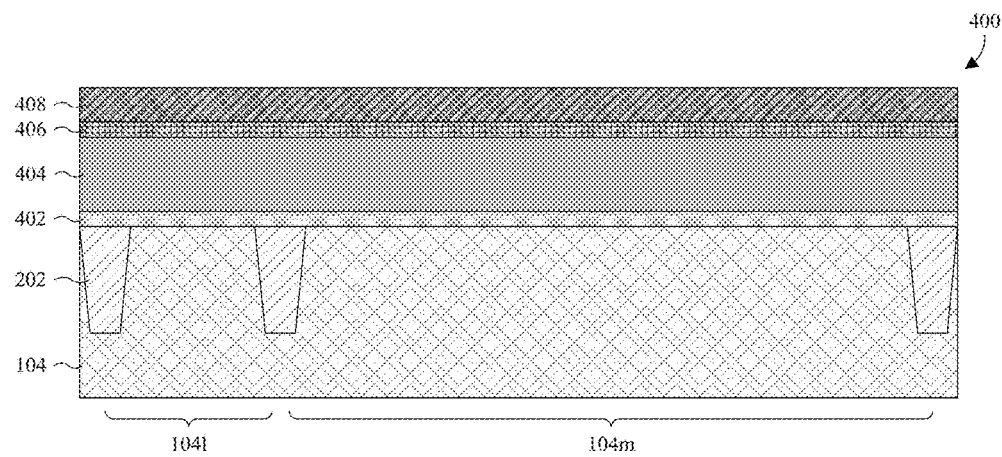
FIGS. 4-19 illustrate a series of cross-sectional views of some embodiments of a method for manufacturing an IC with embedded memory using HKMG technology.

As illustrated by the cross-sectional view 400 of FIG. 4, an isolation structure 202 is formed extending into a top surface of a semiconductor substrate 104 to demarcate a logic region 104$l$ of the semiconductor substrate 104 and a memory region 104$m$ of the semiconductor substrate 104. The isolation structure 202 may be, for example, a shallow trench isolation structure, a deep trench isolation structure, or some type of isolation structure. In some embodiments, a process for forming the isolation structure 202 comprises forming trenches demarcating the memory and logic regions 104$m$, 104$l$ of the semiconductor substrate 104, and subsequently filling the trenches with a dielectric material.

Also illustrated by the cross-sectional view 400 of FIG. 4, a charge storage film 402, a first dummy gate layer 404, a first control gate hard mask layer 406, and a second control gate hard mask layer 408 are formed stacked over the semiconductor substrate 104. The charge storage film 402 is formed covering the semiconductor substrate 104 and the isolation structure 202, and may be, for example, an ONO film or some other type of charge storage film. The first dummy gate layer 404 is formed covering the charge storage film 402 and may be, for example, polysilicon or some other material. The first control gate hard mask layer 406 is formed covering the first dummy gate layer 404 and may be, for example, oxide or another dielectric. The second control gate hard mask layer 408 is formed covering the first control gate hard mask layer 406 and may be, for example, nitride or another dielectric.

In some embodiments, a process for forming the charge storage film 402, the first dummy gate layer 404, the first control gate hard mask layer 406, and the second control gate hard mask layer 408 comprises sequentially performing a plurality of growth and/or deposition processes. The growth and/or deposition processes may comprise, for example, thermal oxidation, chemical or physical vapor deposition, sputtering, some other growth or deposition process, or a combination of the foregoing.

Figure 5:
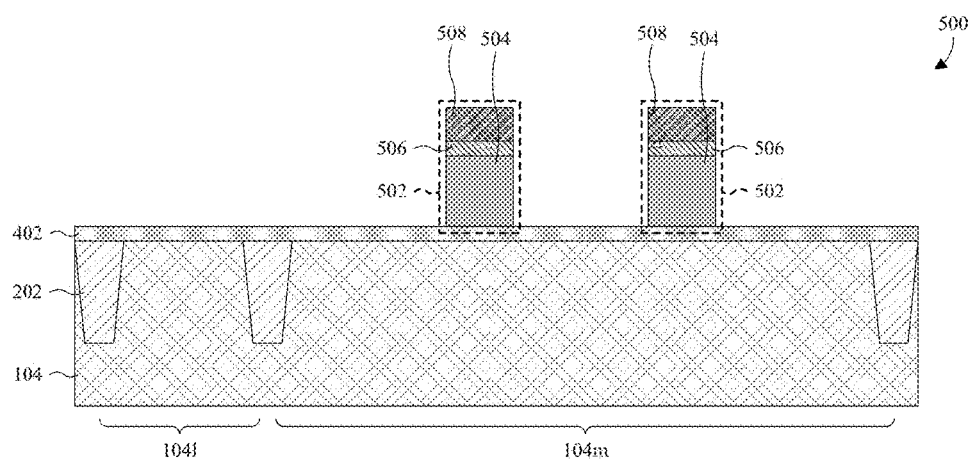

As illustrated by the cross-sectional view 500 of FIG. 5, the first and second control gate hard mask layers 406, 408 (see FIG. 4) and the first dummy gate layer 404 (see FIG. 4) are patterned to define a pair of control gate stacks 502 overlying the charge storage film 402. The control gate stacks 502 are each formed with a dummy control gate 504, a first control gate hard mask 506, and a second control gate hard mask 508. The first control gate hard mask 506 is formed overlying the dummy control gate 504, and the second control gate hard mask 508 is formed overlying the first control gate hard mask 506.

In some embodiments, a process for patterning the first and second control gate hard mask layers 406, 408 and the first dummy gate layer 404 comprises patterning a photoresist layer over the second control gate hard mask layer 408 using photolithography. Further, in some embodiments, the process comprises performing an etch into the first and second control gate hard mask layers 406, 408 and the first dummy gate layer 404 with the patterned photoresist layer in place, and subsequently stripping the patterned photoresist layer.

Figure 6:
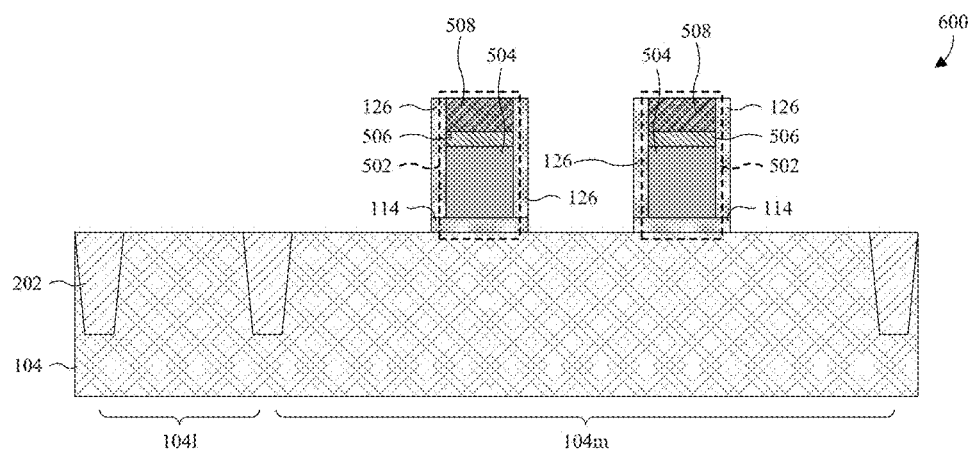

As illustrated by the cross-sectional view 600 of FIG. 6, control gate sidewall spacers 126 are formed over the charge storage film 402 (see FIG. 5) and on sidewalls of the control gate stacks 502. The control gate sidewall spacers 126 may, for example, be formed of nitride, oxide, an ONO film, or some other dielectric.

In some embodiments, a process for forming the control gate sidewall spacers 126 comprises forming a control gate sidewall spacer layer conformally covering and lining the structure of FIG. 5. The control gate sidewall spacer layer may, for example, be formed by vapor deposition, sputtering, or some other growth or deposition process. Further, in some embodiments, the process comprises performing an etch back in to the control gate sidewall spacer layer to remove horizontal segments of the control gate sidewall spacer layer without removing vertical segments of the control gate sidewall spacer layer. The vertical segments correspond to the control gate sidewall spacers 126.

Also illustrated by the cross-sectional view 600 of FIG. 6, the charge storage film 402 (see FIG. 5) is patterned to form a pair of individual charge storage films 114 respectively underlying the dummy control gates 504. The control gates stacks 502 respectively include the individual charge storage films 114. In some embodiments, a process for patterning the charge storage film 402 comprises performing an etch into the charge storage film 402 with the control gate sidewall spacers 126 in place, such that the control gate sidewall spacers 126 and the second control gate hard masks 508 serve as a mask during the etch.

Figure 7:
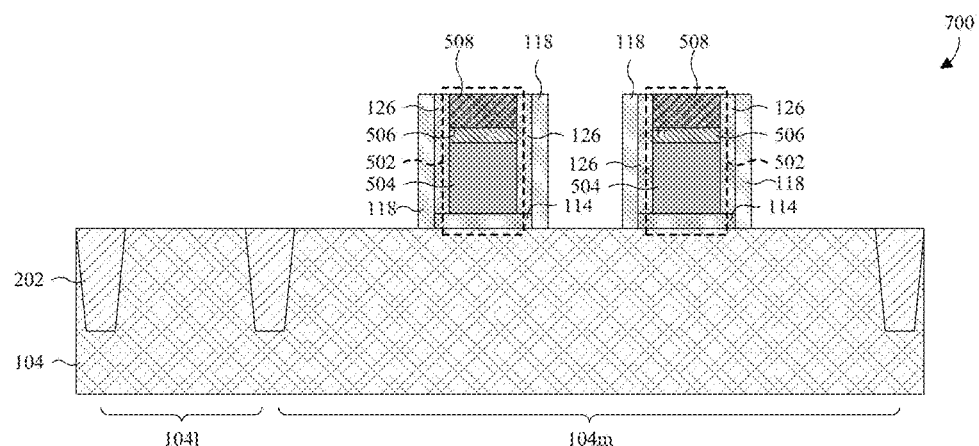

As illustrated by the cross-sectional view 700 of FIG. 7, inter-gate spacers 118 are formed along sidewalls respectively of the control gate sidewall spacers 126 and the individual charge storage films 114. The inter-gate spacers 118 may, for example, be oxide or some other dielectric. In some embodiments, a process for forming the inter-gate spacers 118 comprises forming an inter-gate spacer layer conformally covering and lining the structure of FIG. 6. The inter-gate spacer layer may, for example, be formed by high temperature oxidation (HTO) or some other oxidation process, which may, for example, be followed by rapid thermal annealing (RTA) or some other annealing process. Further, in some embodiments, the process comprises performing an etch back in to the inter-gate spacer layer to remove horizontal segments of the inter-gate spacer layer without removing vertical segments of the inter-gate spacer layer. The vertical segments correspond to the inter-gate spacers 118.

Figure 8:
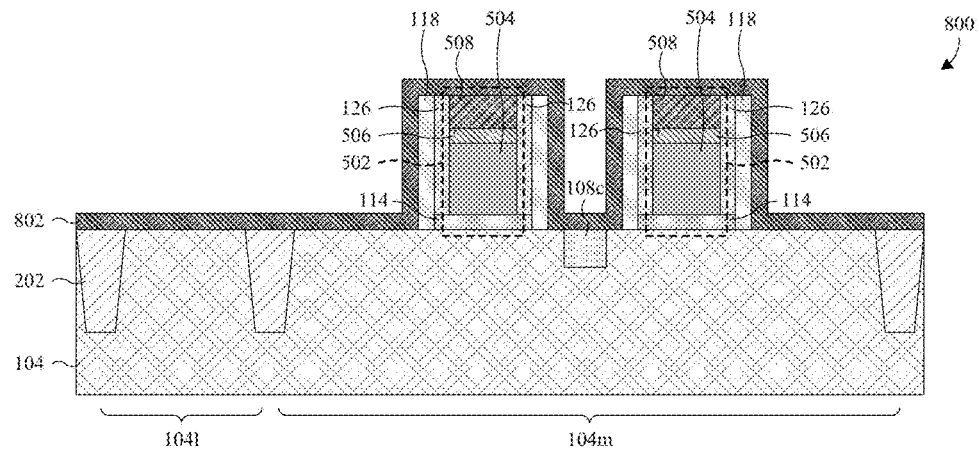

As illustrated by the cross-sectional view 800 of FIG. 8, a first gate dielectric layer 802 is formed covering and conformally lining the structure of FIG. 7. In some embodiments, a process for forming the first gate dielectric layer 802 comprises rapid thermal oxidation (RTO) and/or HTO. Further, in some embodiments, the process comprises RTA.

Also illustrated by the cross-sectional view 800 of FIG. 8, in some embodiments, a common memory source/drain region 108c is formed in the semiconductor substrate 104, between the control gate stacks 502. In some embodiments, the common memory source/drain region 108c is formed by ion implantation while a patterned photoresist layer covers the logic region 104l of the semiconductor substrate 104 and a periphery of the memory region 104m of the semiconductor substrate 104. In other embodiments, the common memory source/drain region 108c is formed by some other process for doping the semiconductor substrate 104, or some other process for forming source/drain regions.

Figure 9:
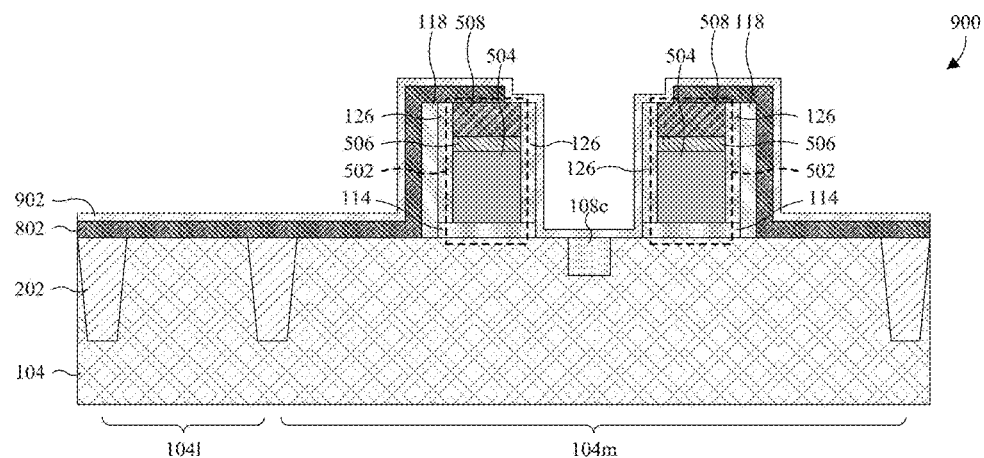

As illustrated the cross-sectional view 900 of FIG. 9, spacers of the inter-gate spacers 118 that are between the control gate stacks 502 are removed, along with a portion of the first gate dielectric layer 802 that is between the control gate stacks 502. In some embodiments, the removal comprises performing an etch into the inter-gate spacers 118 and the first gate dielectric layer 802 while a patterned photoresist layer covers the logic region 104l of the semiconductor substrate 104 and a periphery of the memory region 104m of the semiconductor substrate 104.

Also illustrated by the cross-sectional view 900 of FIG. 9, a second gate dielectric layer 902 is formed covering and conformally lining the semiconductor substrate 104 and the the control gate stacks 502 over the first gate dielectric layer 802. In some embodiments, a process for forming the second gate dielectric layer 902 comprises in situ steam generation (ISSG), HTO, some other oxidation process, or a combination of the foregoing. Further, in some embodiments, the process comprises RTA or some other annealing process.

Figure 10:
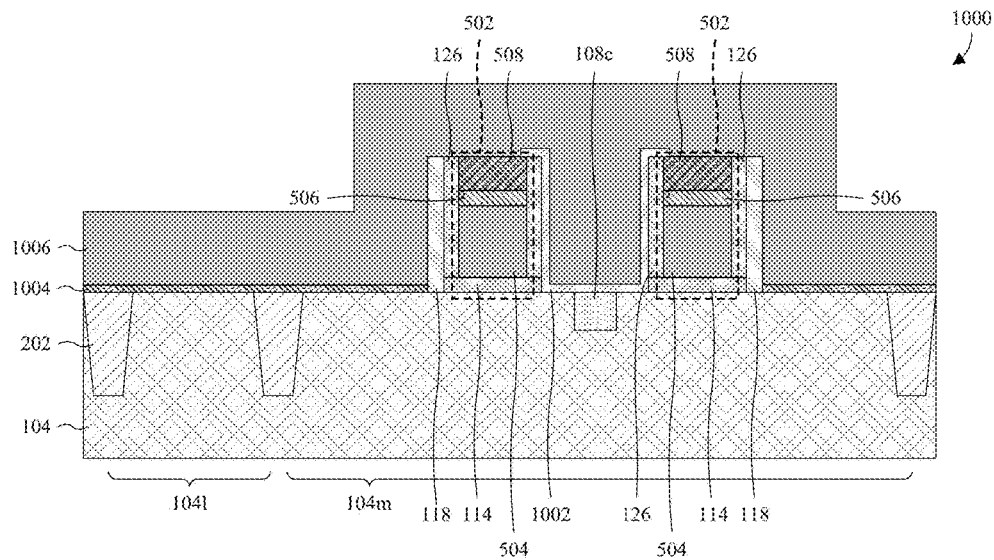

As illustrated by the cross-sectional view 1000 of FIG. 10, the first and second gate dielectric layers 802, 902 (see FIG. 9) are removed from the logic region 104l of the semiconductor substrate 104 and a periphery of the memory region 104m of the semiconductor substrate 104. The removal defines a common source/drain dielectric layer 1002 between the control gate stacks 502. In some embodiments, the removal comprises an etch into the first and second gate dielectric layers 802, 902 while a patterned photoresist layer covers a center of the memory region 104m of the semiconductor substrate 104.

Also illustrated by the cross-sectional view 1000 of FIG. 10, a third gate dielectric layer 1004 is formed along a top surface of the semiconductor substrate 104. The third gate dielectric layer 1004 may, for example, be formed of oxide or some other dielectric, and/or may, for example, be formed by thermal oxidation or some other growth or deposition process. Further, the third gate dielectric layer 1004 may, for example, be formed so it forms directly on semiconductor material, such as the semiconductor substrate 104.

Also illustrated by the cross-sectional view 1000 of FIG. 10, a second dummy gate layer 1006 is formed over the third gate dielectric layer 1004 and conformally lining the control gate stacks 502. In some embodiments, the second dummy gate layer 1006 is formed of polysilicon or some other material. Further, in some embodiments, the second dummy gate layer 1006 is formed by chemical or physical vapor deposition, sputtering, or some other deposition process.

Figure 11:
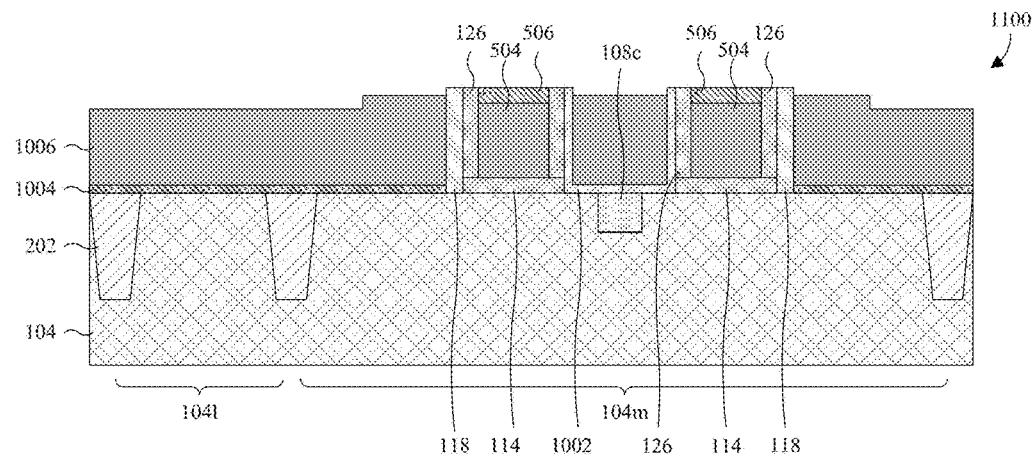

As illustrated by the cross-sectional view 1100 of FIG. 11, a top surface of the second dummy gate layer 1006 is recessed to proximate top surfaces respectively of the dummy control gates 504. For example, the top surface of the second dummy gate layer 1006 may be recessed to a location spaced between top surfaces respectively of the first control gate hard masks 506 and the top surfaces respectively of the dummy control gates 504.

Figure 37:
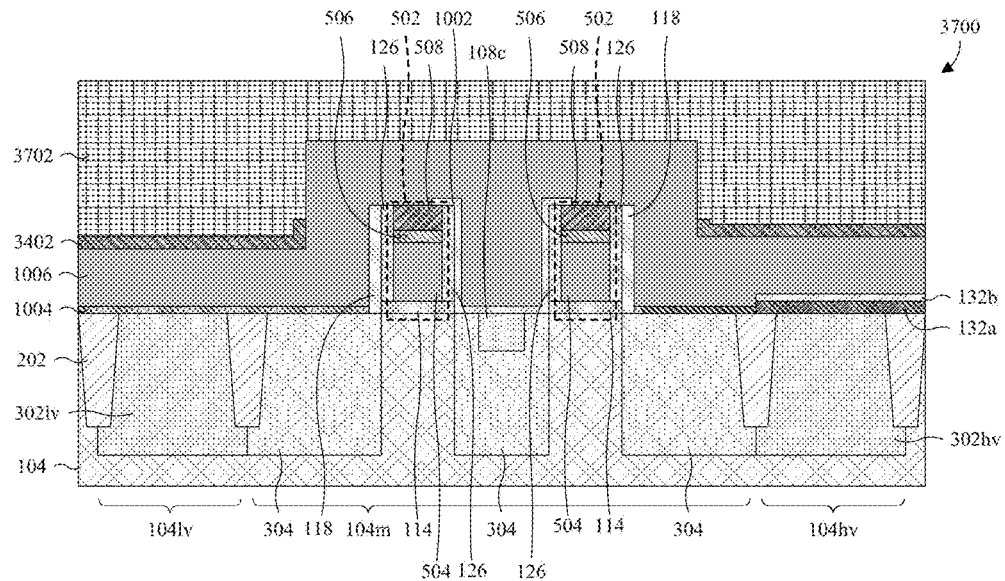
Figure 38:
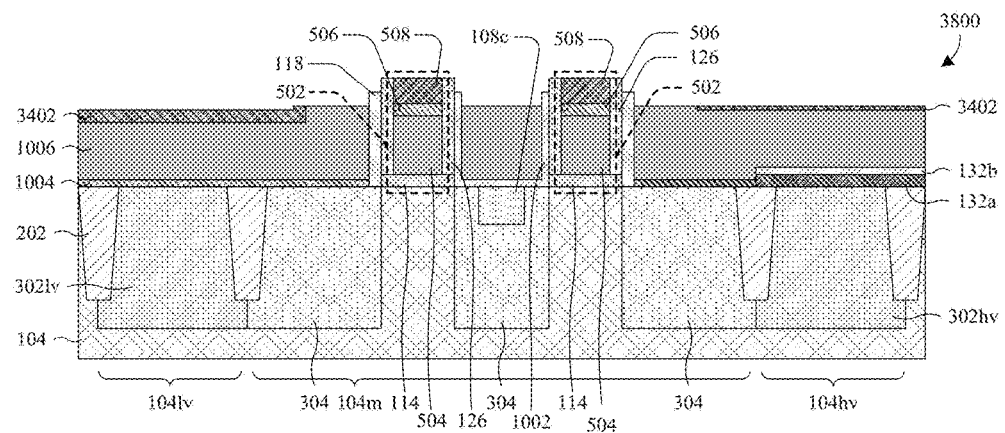

In some embodiments, a process for recessing the top surface of the second dummy gate layer 1006 comprises forming an antireflective coating (ARC) layer covering the second dummy gate layer 1006, and subsequently performing a planarization into a top surface of the ARC layer. The ARC layer may, for example, be formed by spin-on deposition or some other deposition process, and photoresist or some other material may, for example, alternatively be used in place of the ARC layer. The planarization may, for example, be performed by a chemical mechanical polish (CMP) or some other planarization process. Further, in some embodiments, the process comprises performing an etch back into the second dummy gate layer 1006 and the ARC layer until the ARC layer is removed and the top surface of the second dummy gate layer 1006 is recessed to proximate the top surfaces respectively of the dummy control gates 504. During the etch back, the etch back is initially limited to the ARC layer since the ARC layer covers the second dummy gate layer 1006. However, once the etch back reaches the second dummy gate layer 1006, the ARC layer and the second dummy gate layer 1006 are etched back concurrently. This continuous until the ARC layer is removed. In some embodiments, the ARC layer and the second dummy gate layer 1106 have substantially the same etch rates during the etch back, such that the top surfaces respectively of the ARC layer and the second dummy gate layer 1006 are substantially even as they are etched back. An example of the process is shown in FIGS. 37 and 38.

Also illustrated by the cross-sectional view 1100 of FIG. 11, the second control gate hard masks 508 (see FIG. 10) are removed, and top surfaces respectively of the inter-gate spacers 118, the control gate sidewall spacers 126, and the common source/drain dielectric layer 1002 are recessed to proximate to the top surfaces respectively of the dummy control gates 504. In some embodiments, such removal and recessing is performed by etching.

Figure 12:
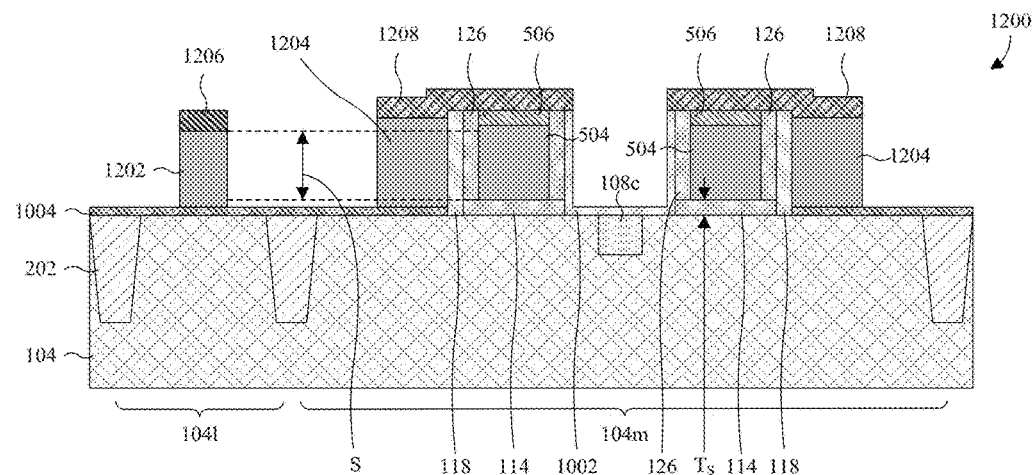

As illustrated by the cross-sectional view 1200 of FIG. 12, the second dummy gate layer 1006 (see FIG. 11) is patterned to form a dummy logic gate 1202 and two dummy select gates 1204. The dummy logic gate 1202 is formed on the logic region 104l of the semiconductor substrate 104. The dummy select gates 1204 are formed on the memory region 104m of the semiconductor substrate 104, respectively bordering the individual charge storage films 114.

In some embodiments, a process for forming the dummy logic gate 1202 and the dummy select gates 1204 comprises forming a dummy hard mask layer covering the second dummy gate layer 1006 and the dummy control gates 504.

The dummy hard mask layer may, for example, be formed of oxide or some other dielectric, and/or may, for example, be formed by vapor deposition, sputtering, or some other deposition process. Further, in some embodiments, the process comprises patterning the dummy hard mask layer to form a dummy logic gate hard mask 1206 and a pair of dummy memory gate hard masks 1208. The patterning may, for example, be performed using photolithography or some other patterning process. Further yet, in some embodiments, the process comprises performing an etch into the second dummy gate layer 1006 with the dummy logic gate hard mask 1206 and the dummy memory gate hard masks 1208 in place to form the dummy logic gate 1202 and the dummy select gates 1204.

Advantageously, the individual charge storage films 114 have a minimal thickness $T_S$, whereby bottom surfaces respectively of the dummy control gates 504 are substantially spaced below a top surface of the dummy logic gate 1202 by an amount S. In some embodiments, the minimal thickness $T_S$ is a thickness that is less than about 5%, 10%, 20%, or 30% of a thickness of the dummy control gates 504, and/or that is less than about one, two, or five times a thickness of the third gate dielectric layer 1004. Further, in some embodiments, the minimal thickness $T_S$ is about 140-220 angstroms, about 160-200 angstroms, or about 140-180 angstroms. The dummy control gates 504, the dummy logic gate 1202, and the dummy select gates 1204 may be replaced with HKMG stacks because the bottom surfaces of the dummy control gates 504 are substantially spaced below the top surface of the dummy logic gate 1202. Absent the spacing, metal control gates formed as part of the HKMG stacks may have a minimal thickness, and embedded memory cells under manufacture may fail.

Figure 13:
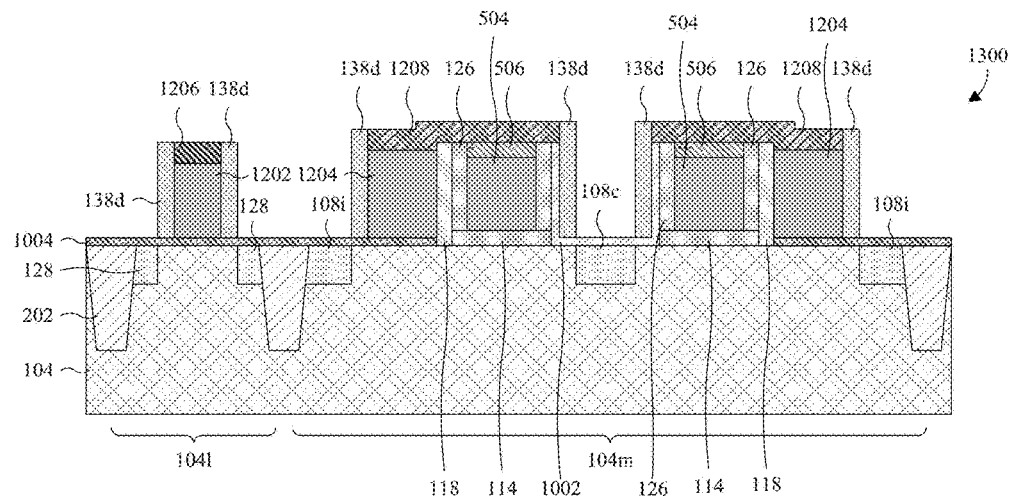

As illustrated by the cross-sectional view 1300 of FIG. 13, main sidewall spacers 138d are formed over the third gate dielectric layer 1004, along sidewalls respectively of the dummy logic gate 1202. Further, the main sidewall spacers 138d are formed along sidewalls respectively of the dummy select gates 1204 that are outside a central region between the dummy control gates 504, as well as along sidewalls respectively of the individual charge storage films 114 and the control gate sidewall spacers 126 that are in the central region. The main sidewall spacers 138d may, for example, be formed of oxide, nitride, or some other dielectric.

In some embodiments, a process for forming the main sidewall spacers 138d comprises forming a main sidewall spacer layer covering and conformally lining the structure of FIG. 12. The main sidewall spacer layer may, for example, be formed by vapor deposition or some other growth or deposition process. Further, in some embodiments, the process comprises performing an etch back in to the main sidewall spacer layer to remove horizontal segments of the main sidewall spacer layer without removing vertical segments of the main sidewall spacer layer. The vertical segments correspond to the main sidewall spacers 138d.

Also illustrated by the cross-sectional view 1300 of FIG. 13, a pair of logic source/drain regions 128 and a pair of individual memory source/drain region 108i are formed in the semiconductor substrate 104. The logic source/drain regions 128 are formed respectively bordering opposite sides of the dummy logic gate 1202. The individual memory source/drain regions 108i are formed respectively bordering the dummy select gates 1204. In some embodiments, the common memory source/drain region 108c may be enhanced (e.g., enlarged). In other embodiments, the common memory source/drain region 108c is not formed at FIG. 8 (as shown), and is instead formed at FIG. 13. The logic source/drain regions 128 and the individual memory source/drain regions 108i may be formed by, for example, ion implantation, some other process for forming doped regions in the semiconductor substrate 104, or some other process for forming source/drain regions. Similarly, the common memory source/drain region 108c may be formed or enhanced by, for example, ion implantation, some other process for forming doped regions in the semiconductor substrate 104, or some other process for forming source/drain regions.

Figure 14:
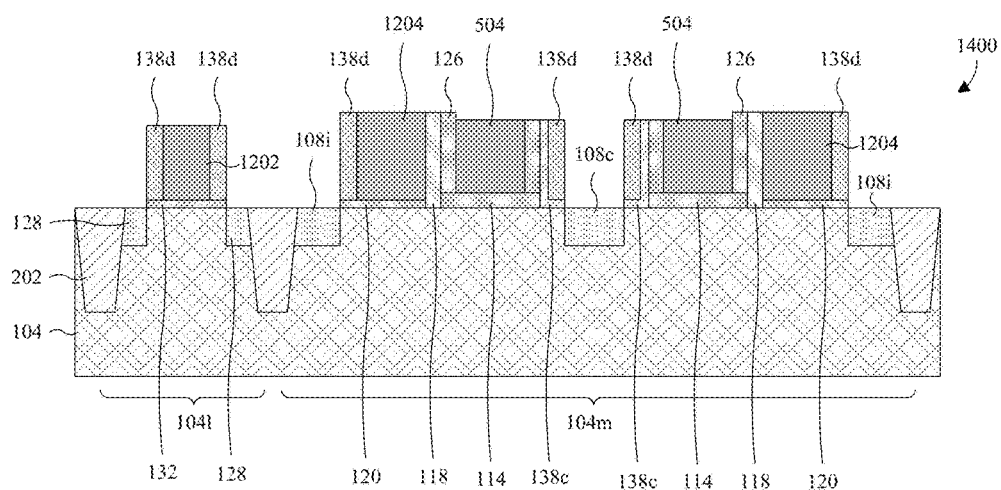

As illustrated by the cross-sectional view 1400 of FIG. 14, the third gate dielectric layer 1004 (see FIG. 13) and the common source/drain dielectric layer 1002 (see FIG. 13) are patterned. The third gate dielectric layer 1004 is patterned to form a base logic gate dielectric layer 132 and a pair of base select gate dielectric layers 120. The base logic gate dielectric layer 132 is formed underlying the dummy logic gate 1202, and the base select gate dielectric layers 120 are respectively formed underlying the dummy select gates 1204. Further, the common source/drain dielectric layer 1002 is patterned to form additional main sidewall spacers 138c between the dummy control gates 504. In some embodiments, the patterning is performed by an etch into the third gate dielectric layer 1004 and the common source/drain dielectric layer 1002. The etch may, for example, use the main sidewall spacers 138d, the dummy logic gate hard mask 1206 (see FIG. 13), and the dummy memory gate hard masks 1208 (see FIG. 13) as a mask.

Also illustrated by the cross-sectional view 1400 of FIG. 14, the dummy logic gate hard mask 1206 (see FIG. 13) and the dummy memory gate hard masks 1208 (see FIG. 13) are removed. Further, top surfaces respectively of the main sidewall spacers 138c, 138d are recessed to proximate top surfaces of respective dummy gates. For example, top surfaces of main sidewall spacers along the dummy logic gate 1202 are recessed to proximate a top surface of the dummy logic gate 1202. Further yet, top surfaces of the control gate sidewall spacers 126 and top surfaces of the inter-gate spacers 118 are recessed to proximate top surfaces of the dummy control and select gates 504, 1204.

In some embodiments, a process for performing the removal of FIG. 14 and the recessing of FIG. 14 comprises forming an ARC layer covering the dummy logic gate hard mask 1206 and the dummy memory gate hard masks 1208, as well as covering the logic source/drain regions 128 and the memory source/drain region 108i, 108c. The ARC layer may, for example, be formed by spin-on deposition or some other deposition process, and photoresist or some other material may, for example, alternatively be used in place of the ARC layer. Further, in some embodiments, the process comprises performing a first etch into the ARC layer to recess the ARC layer to below a top surface of the dummy logic gate 1202. Further yet, in some embodiments, the process comprises performing a second etch into the dummy logic gate hard mask 1206, the dummy memory gate hard masks 1208, the main sidewall spacers 138c, 138d, the control gate sidewall spacers 126, and the inter-gate spacers 118. The second etch continues until the dummy logic gate hard mask 1206 and the dummy memory gate hard masks 1208 are removed, and the main sidewall spacers 138c, 138d, the control gate sidewall spacers 126, and the inter-gate spacers 118 are recessed. Further yet, in some embodiments, the process comprises removing the ARC layer after the second etch.

Figure 15:
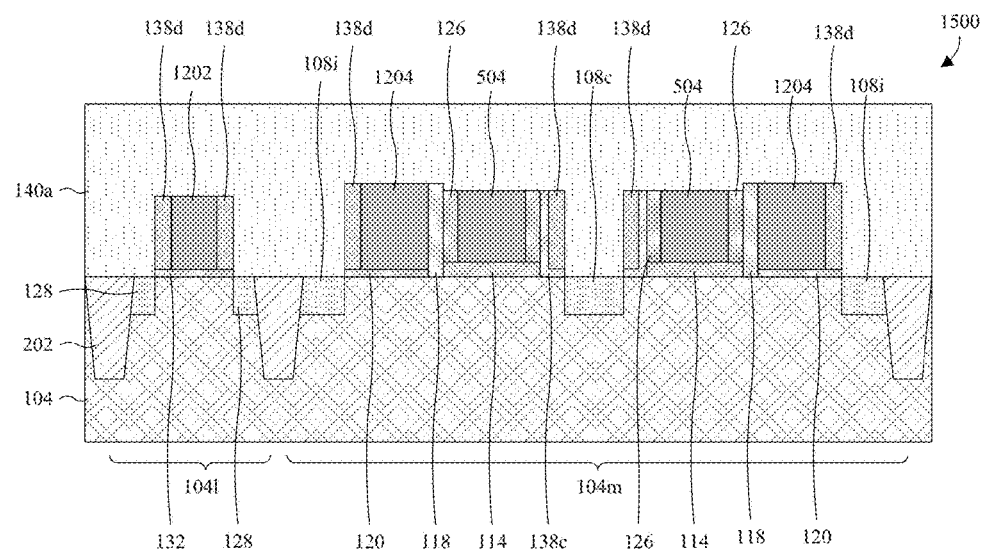

As illustrated by the cross-sectional view 1500 of FIG. 15, a first ILD layer 140a is formed covering the structure of FIG. 14. In some embodiments, the first ILD layer 140*a* is formed by vapor deposition, sputtering, or some other deposition process.

Figure 16:
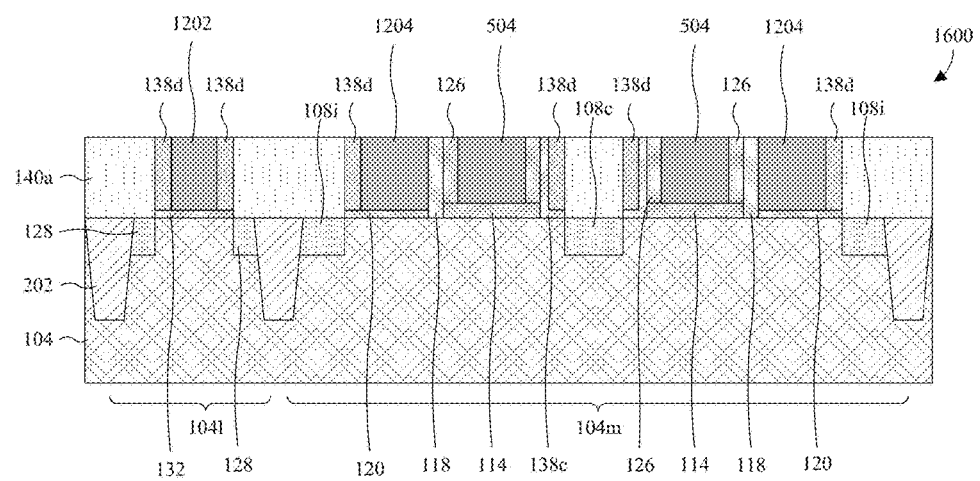

As illustrated by the cross-sectional view 1600 of FIG. 16, a planarization is performed into the first ILD layer 140*a* to coplanarize top surfaces respectively of the first ILD layer 140*a*, the dummy logic gate 1202, the dummy control gates 504, and the dummy select gates 1204. In some embodiments, the planarization is performed by a CMP.

Figure 17:
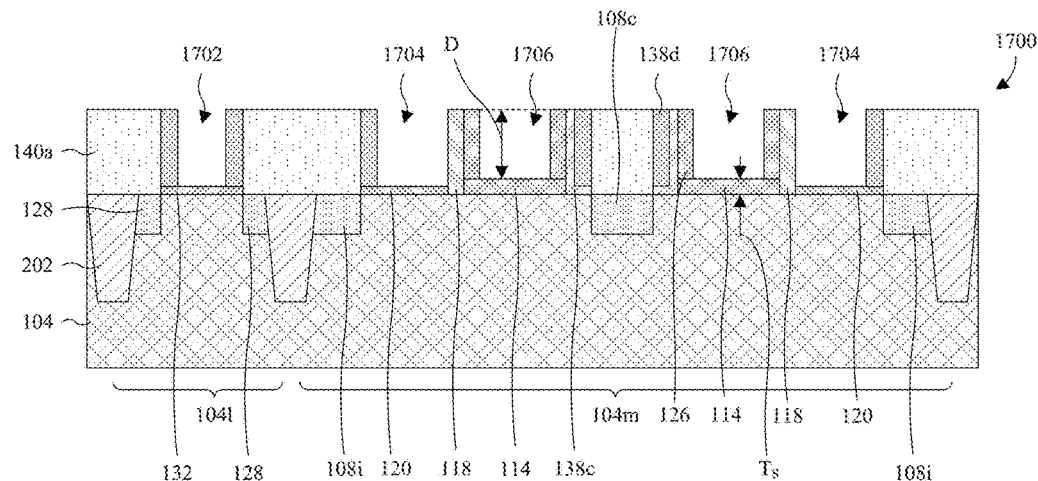

As illustrated by the cross-sectional view 1700 of FIG. 17, the dummy logic gate 1202 (see FIG. 16), the dummy control gates 504 (see FIG. 16), and the dummy select gates 1204 (see FIG. 16) are removed, thereby forming a logic gate opening 1702, a pair of select gate openings 1704, and a pair of control gate openings 1706. In some embodiments, a process for performing the removal comprises performing an etch into the dummy logic gate 1202, the dummy control gates 504, and the dummy select gates 1204. An etchant for the etch may, for example, have a higher etch rate (e.g., 5, 50, 100, or 200 times higher) for the dummy gates (e.g., the dummy logic gate 1202) than surrounding dielectric material (e.g., of the first ILD layer 140*a*).

Advantageously, the individual charge storage films 114 have a minimal thickness $T_S$, such that the control gate openings 1706 have a depth D sufficient to form HKMG stacks therein. If the individual charge storage films 114 were too thick, the depth D would be too small to form HKMG stacks therein. In particular, metal control gates of the HKMG stacks would be too thin for reliable operation of embedded memory cells under manufacture.

Figure 18:
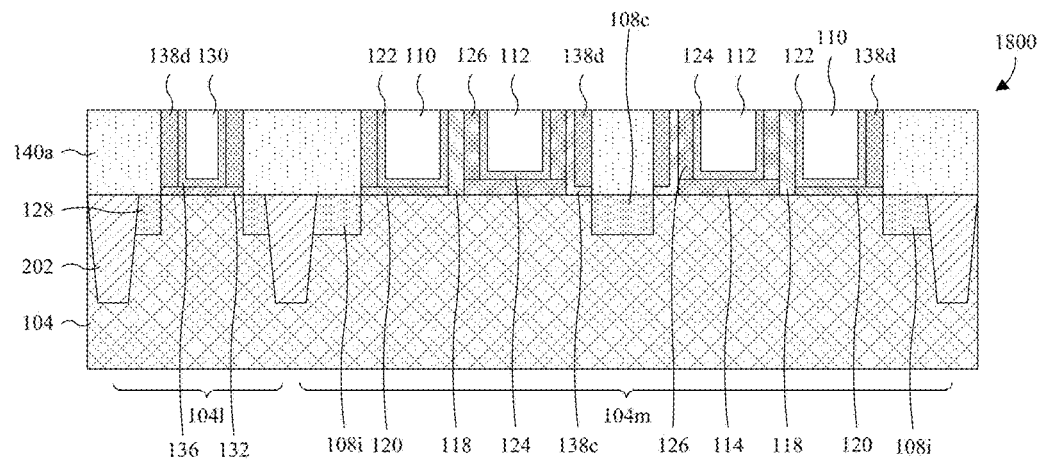

As illustrated by the cross-sectional view 1800 of FIG. 18, a logic gate 130 and a high κ logic gate dielectric layer 136 are formed stacked in the logic gate opening 1702 (see FIG. 17), where the logic gate 130 overlies the high κ logic gate dielectric layer 136. Further, select gates 110 and high κ select gate dielectric layers 122 are formed stacked in the select gate openings 1704 (see FIG. 17), where the select gates 110 respectively overlie the high κ select gate dielectric layer 122. Further yet, control gates 112 and high κ control gate dielectric layer 124 are formed stacked in the control gate openings 1706 (see FIG. 17), where the control gates 112 respectively overlie the high κ control gate dielectric layer 122. In some embodiments, the logic gate 130, the control gates 112, and the select gates 110 are formed of metal.

In some embodiments, a process for forming the logic gate 130, the control gates 112, and the select gates 110, as well as the high κ logic gate dielectric layer 136, the high κ control gate dielectric layer 124, and the high κ select gate dielectric layer 122, comprises forming a high κ dielectric layer conformally lining and covering the structure of FIG. 17. The high κ dielectric layer may, for example, be formed by vapor deposition or some other deposition process. Further, in some embodiments, the process comprises forming a metal layer covering the high κ dielectric layer and filling the logic gate opening 1702, the select gate openings 1704, and the control gate openings 1706 over the high κ dielectric layer. The metal layer may, for example, be formed by vapor deposition, electrochemical plating, or some other deposition or growth process. Further yet, in some embodiments, the process comprises performing a planarization into the high κ dielectric layer and the metal layer until a top surface of the first ILD layer 140*a* is reached. The planarization may, for example, be performed by CMP or some other planarization process.

Figure 19:
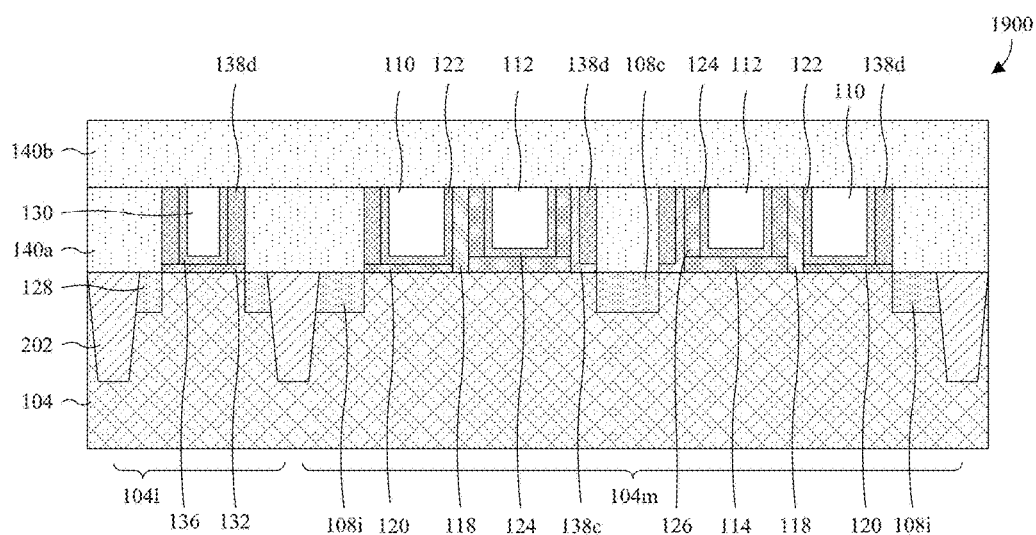

As illustrated by the cross-sectional view 1900 of FIG. 19, a second ILD layer 140*b* is formed covering the structure of FIG. 18. The second ILD layer 140*b* may, for example, be formed by vapor deposition, sputtering, or some other deposition process, and/or may, for example, be formed with a planar or substantially planar top surface. In some embodiments, contact vias (not shown) are also formed extending through the first and second ILD layers 140*a*, 140*b* to the logic source/drain regions 128, the memory source/drain regions 108*i*, 108*c*, the logic gate 130, the select gates 110, the control gates 112, or a combination of the foregoing.

While FIGS. 4-20 illustrate the replacement of the dummy logic gate 1202 (see FIG. 16), the dummy control gates 504 (see FIG. 16), and the dummy select gates 1204 (see FIG. 16) with HKMG stacks, it is to be appreciated that the replacement may not be performed for all of the dummy gates in other embodiments. For example, the dummy select and/or control gates 1204, 504 may not be replaced with HKMG stacks. In such embodiments, the dummy gates that are not replaced are masked during gate removal at FIG. 17 and subsequently used in production.

Figure 20:
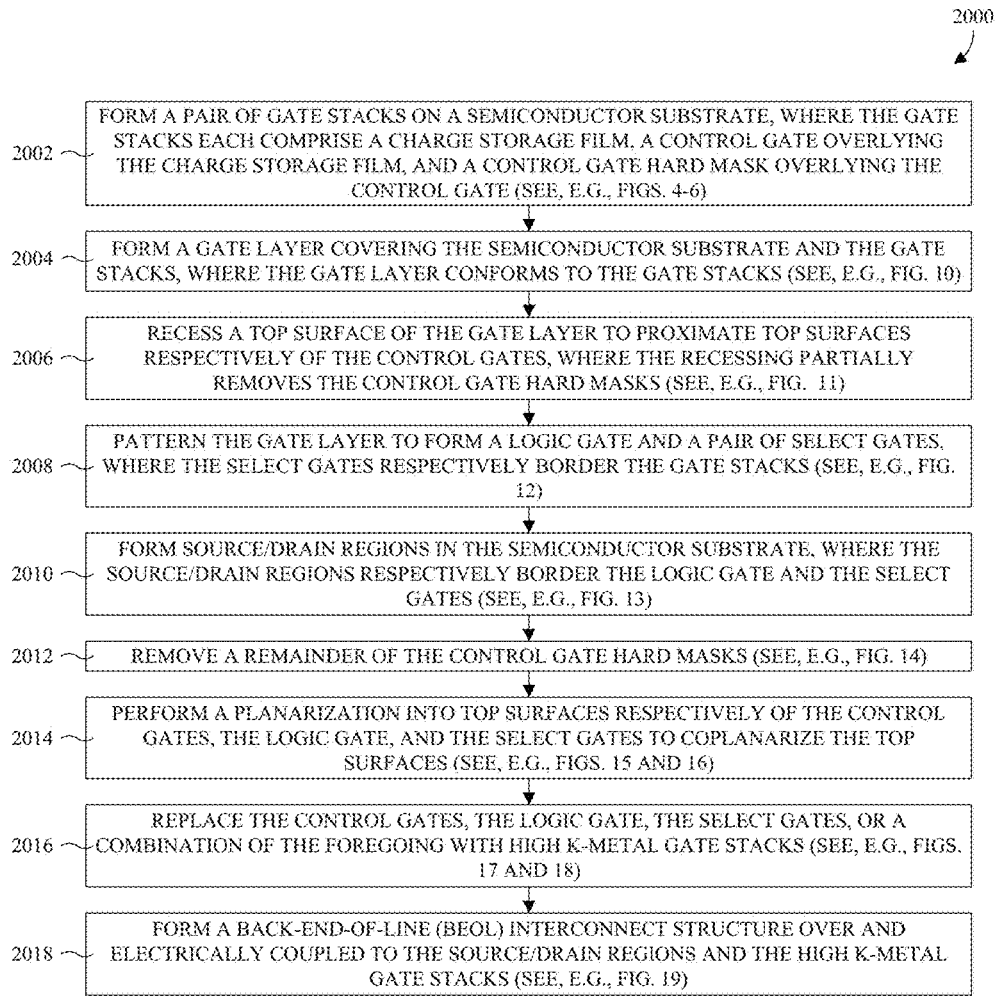
FIG. 20 illustrates a flowchart of some embodiments of the method of FIGS. 4-19.

With reference to FIG. 20, a flowchart 2000 of some embodiments of the method of FIGS. 4-19 is provided.

At 2002, a pair of gate stacks is formed on a semiconductor substrate. The gate stacks each comprise a charge storage film, a control gate overlying the charge storage film, and a control gate hard mask overlying the control gate. See, for example, FIGS. 4-6.

At 2004, a gate layer is formed covering the semiconductor substrate and the gate stacks. The gate layer conforms to the gate stacks. See, for example, FIG. 10.

At 2006, a top surface of the gate layer is recessed to proximate top surfaces respectively of the control gates. Further, the first etch partially removes the control gate hard masks. See, for example, FIG. 11.

At 2008, the gate layer is patterned to form a logic gate and a pair of select gates. The select gates respectively border the gate stacks. See, for example, FIG. 12.

At 2010, source/drain regions are formed in the semiconductor substrate. The source/drain regions respectively border the logic gate and the select gates. See, for example, FIG. 13.

At 2012, a remainder of the control gate hard masks is removed. See, for example, FIG. 14.

At 2014, a planarization is performed into top surfaces respectively of the control gates, the logic gate, and the select gates to coplanarize the top surfaces. See, for example, FIGS. 15 and 16.

At 2016, the control gates, the logic gate, the select gates, or a combination of the foregoing are replaced with HKMG stacks. See, for example, FIGS. 17 and 18. Each of the HKMG stacks comprises a metal gate and a high κ dielectric layer underlying the metal gate.

At 2018, a back-end-of-line (BEOL) interconnect structure is formed over and electrically coupled to the source/drain regions and the HKMG stacks. See, for example, FIG. 19.

Advantageously, the charge storage films have a minimal thickness relative to the control and logic gates. As such, the control gates have bottom surfaces that are sufficiently spaced below a top surface of the logic gate for use with HKMG replacement.

While the flowchart 2000 of FIG. 20 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 21-53, a series of cross-sectional views 2100-5300 illustrate some more detailed embodiments of the method of FIGS. 4-19. Such more detailed embodiments may, for example, be employed to manufacture the IC of FIG. 3.

Figure 21:
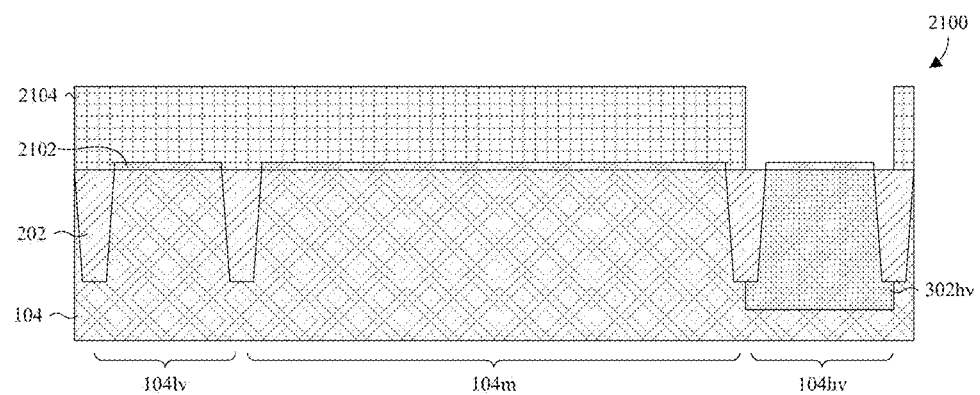
FIGS. 21-53 illustrate a series of cross-sectional views of some more detailed embodiments of the method of FIGS. 4-19.

As illustrated by the cross-sectional view 2100 of FIG. 21, an isolation structure 202 is formed extending into a top surface of a semiconductor substrate 104. The isolation structure 202 is formed demarcating a high voltage logic region 104hv of the semiconductor substrate 104, a low voltage logic region 104lv of the semiconductor substrate 104, and a memory region 104m of the semiconductor substrate 104. Further, a pad layer 2102 is formed covering the high and low voltage logic regions 104hv, 104lv of the semiconductor substrate 104, as well as the memory region 104m of the semiconductor substrate 104.

In some embodiments, a process for forming the isolation structure 202 comprises forming the pad layer 2102 over the semiconductor substrate 104, and forming a second pad layer over the pad layer 2102. The pad layer 2102 may, for example, be formed of oxide or some other dielectric layer, and/or the second pad layer may, for example, be formed of nitride or some other dielectric material. Further, in some embodiments, the process comprises patterning the pad layer 2102 and the second pad layer using photolithography, and performing an etch into the semiconductor substrate 104 with the pad layer 2102 and the second pad layer in place to form trenches corresponding to the isolation structure 202. Further yet, in some embodiments, the process comprises filling the trenches with dielectric material, and removing the second pad layer, but not the pad layer 2102.

Also illustrated by the cross-sectional view 2100 of FIG. 21, a high voltage well 302hv is formed in the high voltage logic region 104hv of the semiconductor substrate 104. In some embodiments, the high voltage well 302hv is formed by ion implantation into the high voltage logic region 104hv of the semiconductor substrate 104 while a patterned photoresist layer 2104 covers the low voltage logic region 104lv of the semiconductor substrate 104 and the memory region 104m of the semiconductor substrate 104. In other embodiments, the high voltage well 302hv is formed by some other process for forming doped regions in the semiconductor substrate 104. The patterned photoresist layer 2104 is subsequently stripped. In some embodiments, another high voltage well (not shown) having an opposite doping type (e.g., p-type vs. n-type) as the high voltage well 302hv is formed in the semiconductor substrate 104. The other high voltage well may, for example, be formed in the same manner as the high voltage well 302hv, except that a different patterned photoresist layer may be used.

Figure 22:
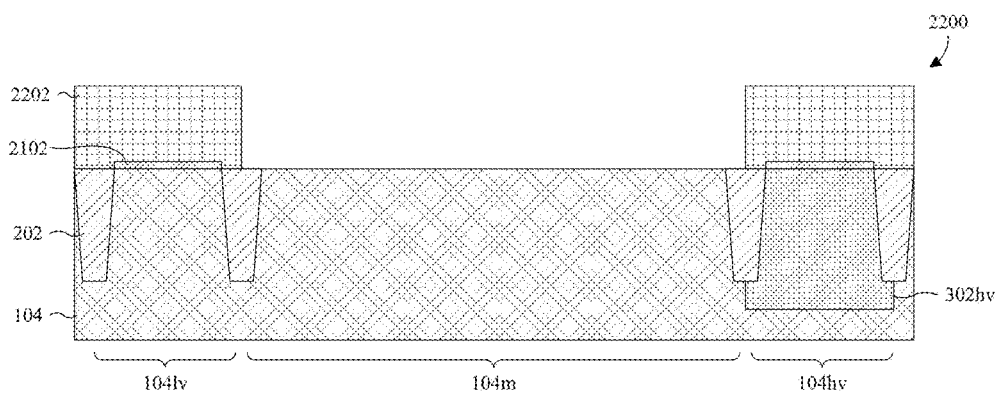

As illustrated by the cross-sectional view 2200 of FIG. 22, the pad layer 2102 is removed from the memory region 104m of the semiconductor substrate 104, but not the low and high voltage logic regions 104lv, 104hv of the semiconductor substrate 104. In some embodiments, the removal is performed by an etch into the pad layer 2102 while a patterned photoresist layer 2202 covers the low and high voltage logic regions 104lv, 104hv of the semiconductor substrate 104. The patterned photoresist layer 2202 is subsequently stripped.

Figure 23:
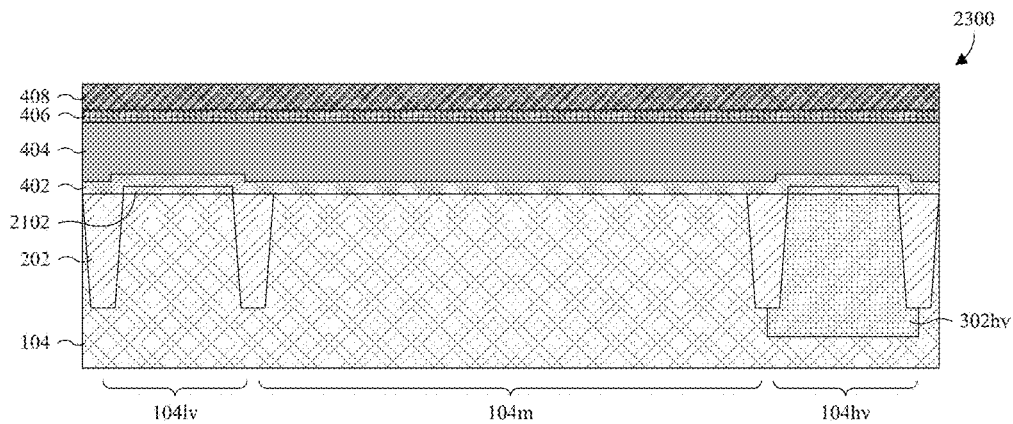

As illustrated by the cross-sectional view 2300 of FIG. 23, a charge storage film 402, a first dummy gate layer 404, a first control gate hard mask layer 406, and a second control gate hard mask layer 408 are formed stacked over the semiconductor substrate 104. Such a stack may be formed as described with regard to FIG. 4.

Figure 24:
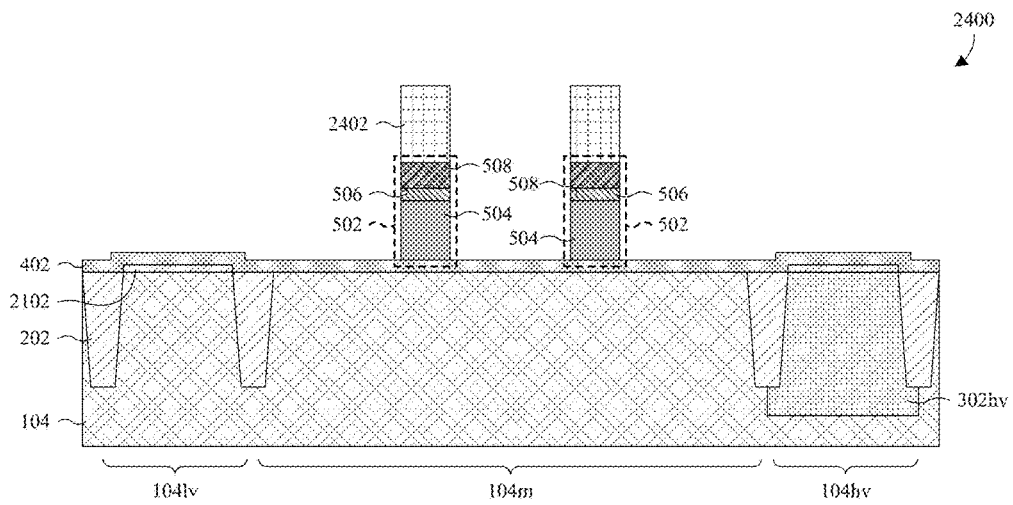

As illustrated by the cross-sectional view 2400 of FIG. 24, the first and second control gate hard mask layers 406, 408 (see FIG. 23) and the first dummy gate layer 404 (see FIG. 23) are patterned to define a pair of control gate stacks 502 overlying the charge storage film 402. Each of the control gate stacks 502 is formed with a dummy control gate 504, a first control gate hard mask 506, and a second control gate hard mask 508. The first control gate hard mask 506 is formed overlying the dummy control gate 504, and the second control gate hard mask 508 is formed overlying the first control gate hard mask 506. In some embodiments, the patterning comprises performing an etch into the first and second control gate hard mask layers 406, 408 and the first dummy gate layer 404 with a patterned photoresist layer 2402 in place. The patterned photoresist layer 2402 is subsequently stripped.

Figure 25:
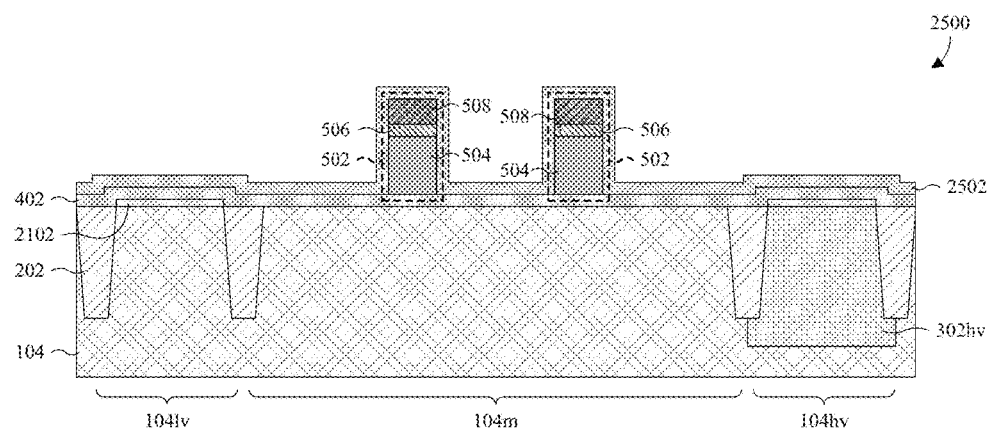

As illustrated by the cross sectional view 2500 of FIG. 25, a control gate sidewall spacer layer 2502 is formed covering and conformally lining the charge storage film 402 and the control gate stacks 502.

Figure 26:
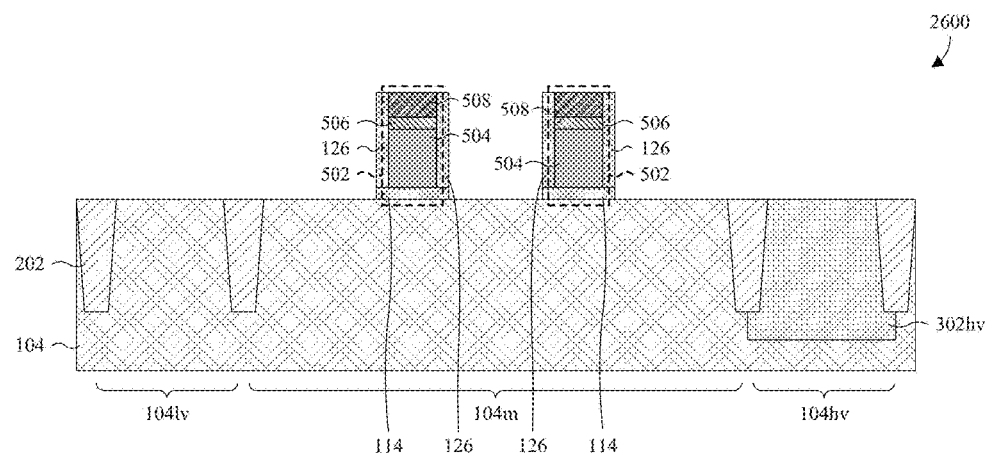

As illustrated by the cross-sectional view 2600 of FIG. 26, horizontal segments of the control gate sidewall spacer layer 2502 (see FIG. 25) are removed without removing vertical segments of the control gate sidewall spacer layer 2502. The vertical segments of the control gate sidewall spacer layer 2502 define control gate sidewall spacers 126 along sidewalls of the control gate stacks 502. In some embodiments, the horizontal segments are removed by an etch back of the control gate sidewall spacer layer 2502.

Also illustrated by the cross-sectional view 2600 of FIG. 26, the charge storage film 402 (see FIG. 25) is patterned to define a pair of individual charge storage films 114 respectively underlying the dummy control gates 504. The control gates stacks 502 respectively include the individual charge storage films 114. In some embodiments, the charge storage film 402 is patterned by continuing the etch back of the control gate sidewall spacer layer 2502 (see FIG. 25) into the charge storage film 402, such that the control gate sidewall spacers 126 and the second control gate hard masks 508 serve as a mask for the patterning. Further, the pad layer 2102 (see FIG. 25) is removed while patterning the charge storage film 402 and/or during the etch back. The pad layer 2102 may, for example, serve as an etch stop to protect the low and high voltage logic regions 104lv, 104hv of the semiconductor substrate 104 from damage while patterning the charge storage film 402 and/or during the etch back.

Figure 27:
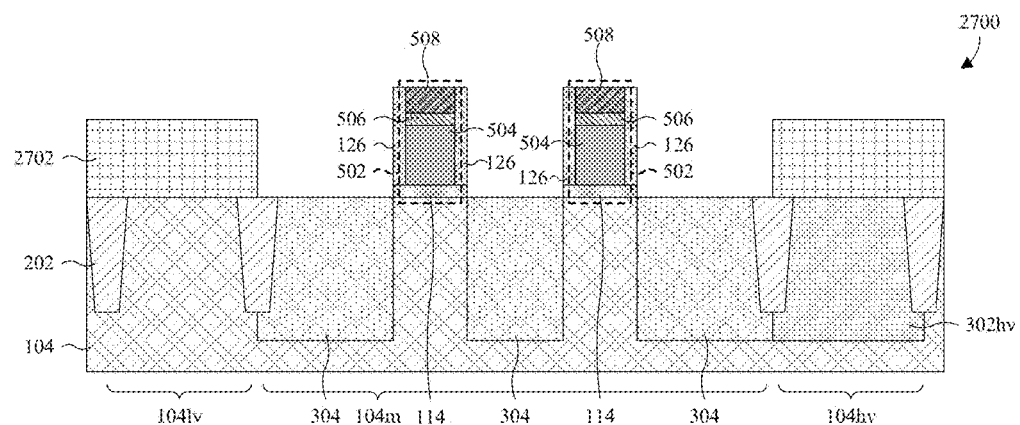

As illustrated by the cross-sectional view 2700 of FIG. 27, in some embodiments, a threshold adjustment region 304 is formed in the memory region 104m of the semiconductor substrate 104. In some embodiments, the threshold adjustment region 304 is formed by ion implantation while a patterned photoresist layer 2702 covers the low and high voltage logic regions 104lv, 104hv of the semiconductor substrate 104. In other embodiments, the threshold adjustment region 304 is formed by some other process for forming doped regions in the semiconductor substrate 104. The patterned photoresist layer 2702 is subsequently stripped.

Figure 28:
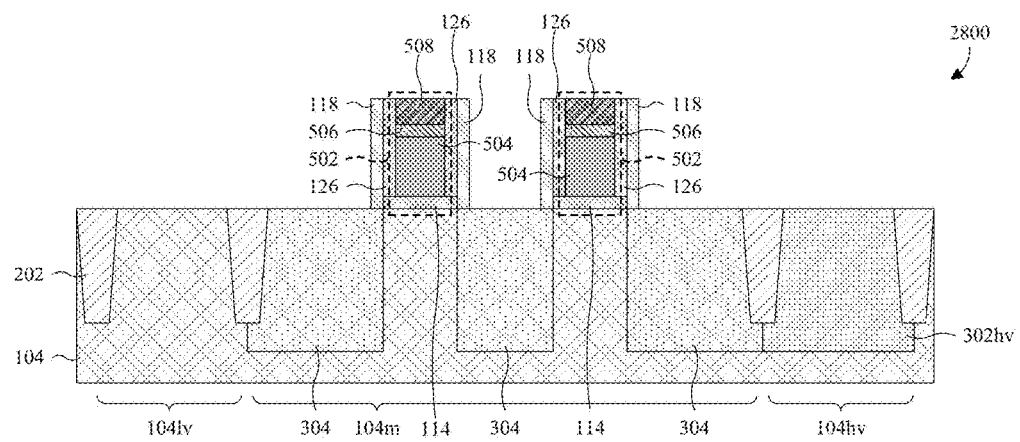

As illustrated by the cross-sectional view 2800 of FIG. 28, inter-gate spacers 118 are formed along sidewalls of the control gate sidewall spacers 126 and the individual charge storage films 114. In some embodiments, a process for forming the inter-gate spacers 118 comprises forming an inter-gate spacer layer covering and conformally lining the structure of FIG. 27, and performing an etch back of the inter-gate spacer layer to remove horizontal segments of the inter-gate spacer layer without removing vertical segments of the inter-gate spacer layer. The vertical segments correspond to the inter-gate spacers 118. The inter-gate spacer layer may, for example, be formed by HTO or some other oxidation process, which may, for example, be followed by RTA or some other annealing process.

Figure 29:
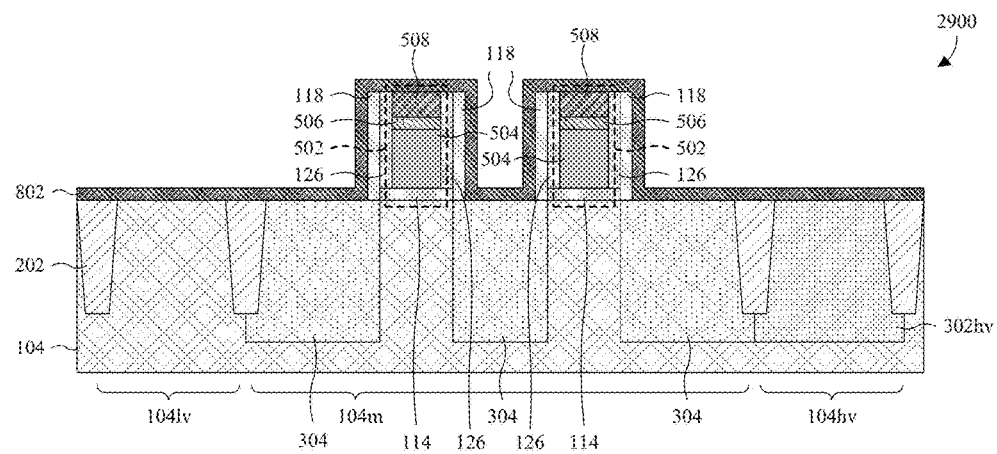

As illustrated by the cross-sectional view 2900 of FIG. 29, a first gate dielectric layer 802 is formed covering and conformally lining the structure of FIG. 27. In some embodiments, a process for forming the first gate dielectric layer 802 comprises RTO, HTO, some other oxidation process, or a combination of the foregoing. Further, in some embodiments, the process comprises RTA, some other annealing process, or a combination of the foregoing.

Figure 30:
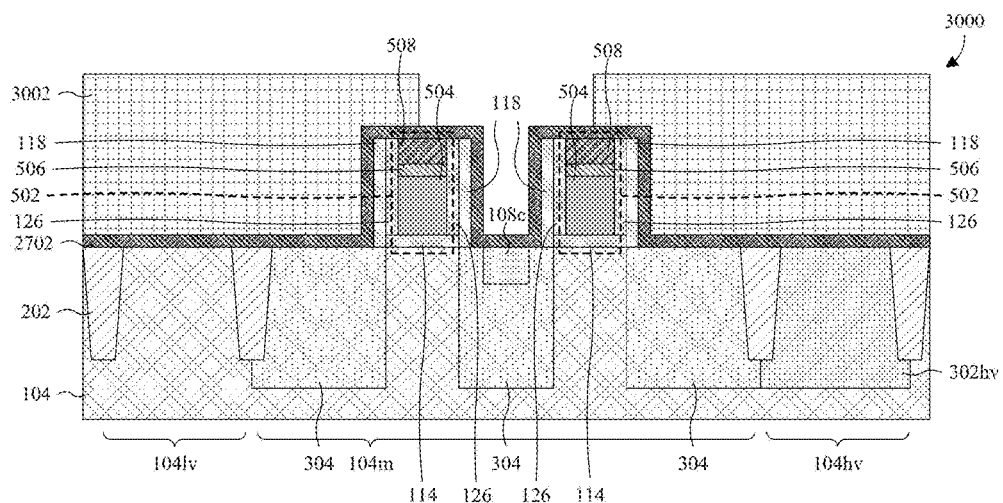

As illustrated by the cross-sectional view 3000 of FIG. 30, a common memory source/drain region 108c is formed in the memory region 104m of the semiconductor substrate 104, between the control gate stacks 502. In some embodiments, the common memory source/drain region 108c is formed by ion implantation while a patterned photoresist layer 3002 covers the low and high voltage logic regions 104lv, 104hv of the semiconductor substrate 104 and a periphery of the memory region 104m of the semiconductor substrate 104. In other embodiments, the common memory source/drain region 108c is formed by some other process for forming doped regions in the semiconductor substrate 104.

Figure 31:
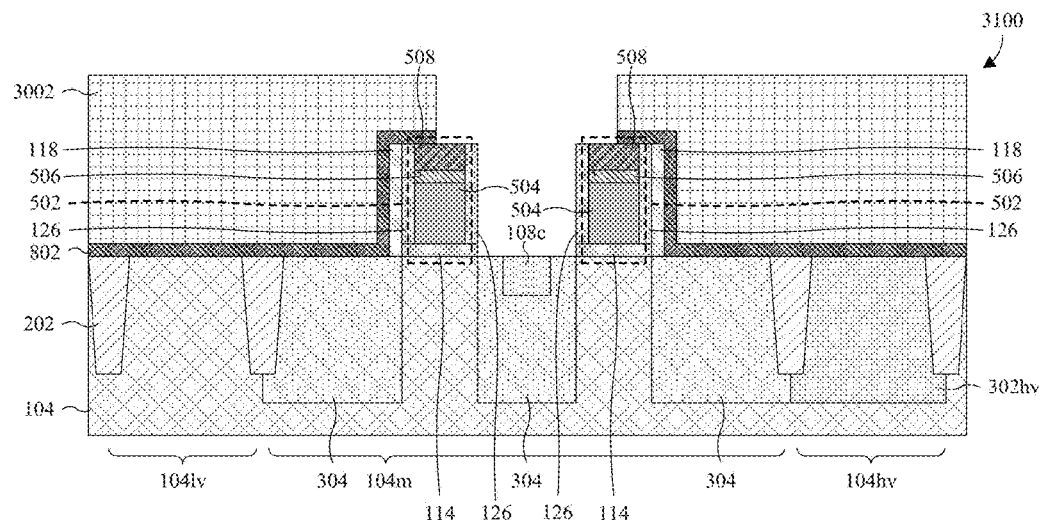

As illustrated the cross-sectional view 3100 of FIG. 31, spacers of the inter-gate spacers 118 that are between the control gate stacks 502 are removed, along with a portion of the first gate dielectric layer 802 that is between the control gate stacks 502. In some embodiments, the removal comprises performing an etch into the inter-gate spacers 118 and the first gate dielectric layer 802 while the patterned photoresist layer 3002 of FIG. 30 is in place. The patterned photoresist layer 3002 is subsequently stripped.

Figure 32:
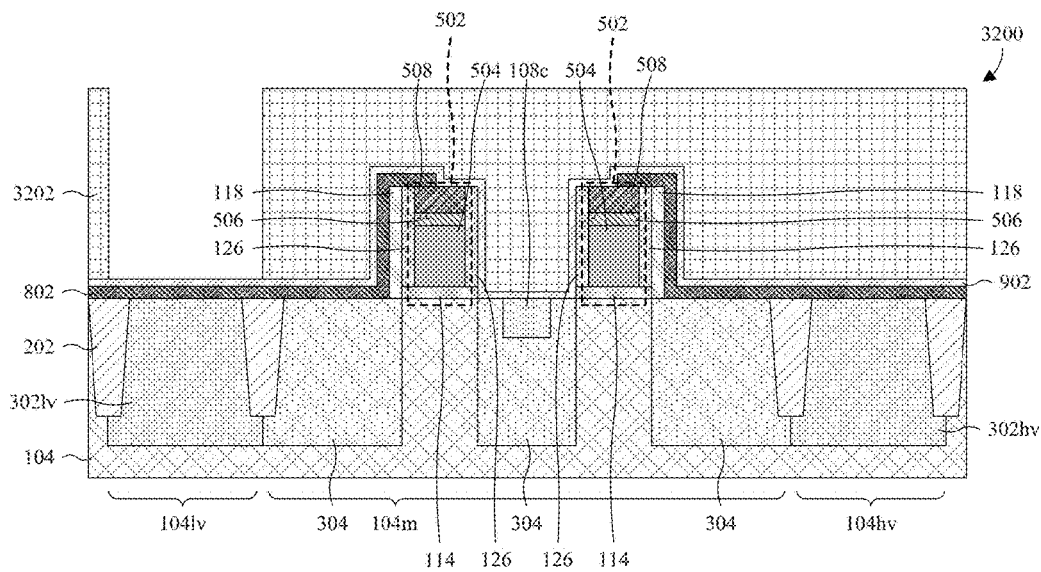

As illustrated by the cross-sectional view 3200 of FIG. 32, a second gate dielectric layer 902 is formed covering and conformally lining the structure of FIG. 31. In some embodiments, a process for forming the second gate dielectric layer 902 comprises ISSG, HTO, some other oxidation process, some other deposition process, or a combination of the foregoing. Further, in some embodiments, the process comprises RTA, some other annealing process, or a combination of the foregoing.

Also illustrated by the cross-sectional view 3200 of FIG. 32, a low voltage well 302lv is formed in the low voltage logic region 104lv of the semiconductor substrate 104. In some embodiments, the low voltage well 302lv is formed by ion implantation while a patterned photoresist layer 3202 covers the high voltage logic region 104hv of the semiconductor substrate 104 and the memory region 104m of the semiconductor substrate 104. The patterned photoresist layer 3202 is subsequently stripped. In other embodiments, the low voltage well 302lv is formed by some other process for forming doped regions in the semiconductor substrate 104.

In some embodiments, the first and second gate dielectric layers 802, 902 are removed from an input/output (IO) region (not shown) of the semiconductor substrate 104 by, for example, a etch performed using photolithography. The IO region may, for example, be adjacent to the low voltage logic region 104lv of the semiconductor substrate 104. Further, in some embodiments, an IO dielectric layer is formed on the IO region of the semiconductor substrate 104 by, for example, thermal oxidation, or some other growth or deposition process.

Figure 33:
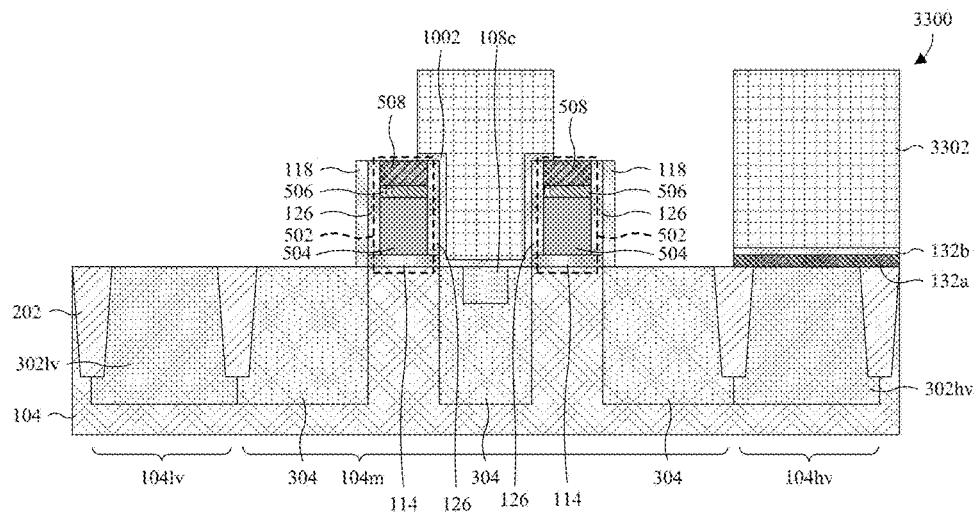

As illustrated by the cross-sectional view 3300 of FIG. 33, the first and second gate dielectric layers 802, 902 (see FIG. 32) are removed from the low voltage logic region 104lv of the semiconductor substrate 104 and a periphery of the memory region 104m of the semiconductor substrate 104. The removal defines a pair of high voltage gate dielectric layers 132a, 132b on the high voltage logic region 104hv of the semiconductor substrate 104, and a common source/drain dielectric layer 1002 between the dummy control gates 504. In some embodiments, the removal comprises an etch into the first and second gate dielectric layers 802, 902 while a patterned photoresist layer 3302 covers the high voltage logic region 104hv of the semiconductor substrate 104 and a center of the memory region 104m of the semiconductor substrate 104. The patterned photoresist layer 3302 is subsequently stripped.

Figure 34:
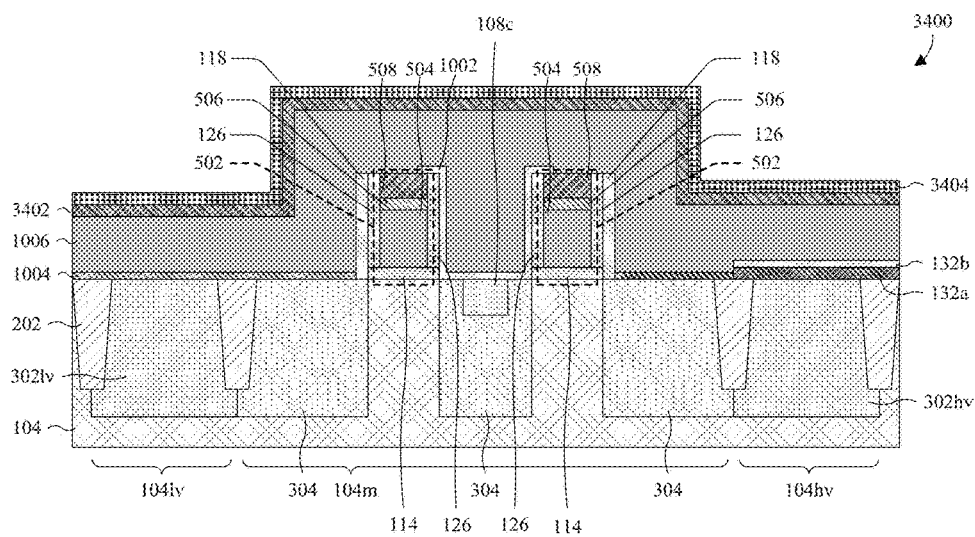

As illustrated by the cross-sectional view 3400 of FIG. 34, a third gate dielectric layer 1004 and a second dummy gate layer 1006 are formed. The third gate dielectric layer 1004 is formed on exposed portions of the semiconductor substrate 104. The second dummy gate layer 1006 is formed covering and conformally lining the third gate dielectric layer 1004 and the control gate stacks 502. The third gate dielectric layer 1004 and/or the second dummy gate layer 1006 may, for example, be formed as described with regard to FIG. 10.

Also illustrated by the cross-sectional view 3400 of FIG. 34, a first logic hard mask layer 3402 and an second logic hard mask layer 3404 are formed stacked over and conformally lining the second dummy gate layer 1006, such that the second logic hard mask layer 3404 overlies the first logic hard mask layer 3402. The first logic hard mask layer 3402 may, for example, be silicon nitride or some other dielectric, and/or the second logic hard mask layer 3404 may, for example, be tetraethylorthosilicate (TEOS) oxide or some other dielectric. The first and second logic hard mask layers 3402, 3404 may, for example, be formed by vapor deposition, sputtering, or some other deposition process.

Figure 35:
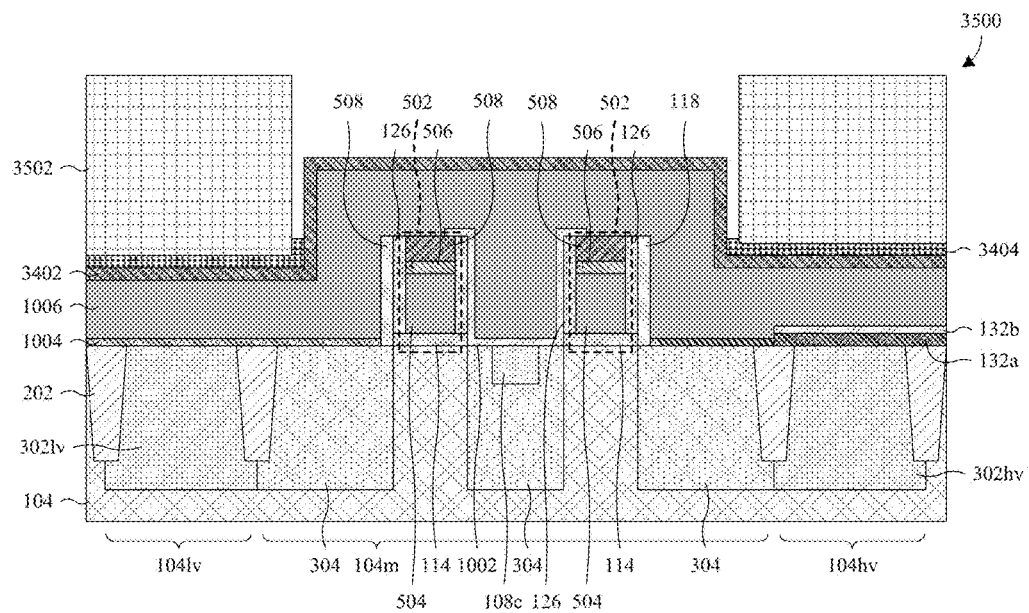

As illustrated by the cross-sectional view 3500 of FIG. 35, the second logic hard mask layer 3404 is removed from the memory region 104m of the semiconductor substrate 104. In some embodiments, the removal comprises performing an etch into the second logic hard mask layer 3404 while a patterned photoresist layer 3502 covers the low and high voltage logic regions 104lv, 104hv of the semiconductor substrate 104. The patterned photoresist layer 3502 is subsequently stripped.

Figure 36:
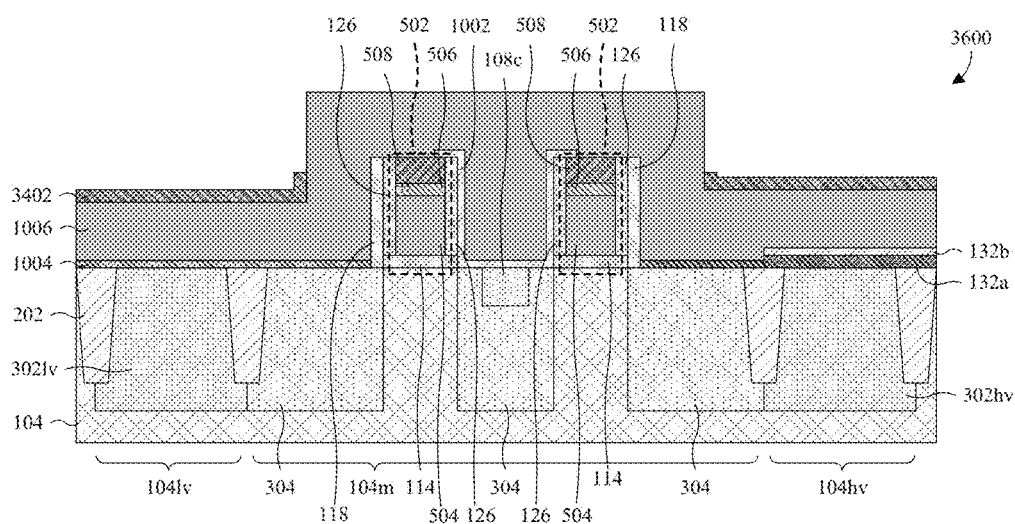

As illustrated by the cross-sectional view 3600 of FIG. 36, the first logic hard mask layer 3402 is removed from the memory region 104m of the semiconductor substrate 104. In some embodiments, the removal comprises performing an etch (e.g., a wet etch) into the first logic hard mask layer 3402 while the second logic hard mask layer 3404 (see FIG. 35) covers the low and high voltage logic regions 104lv, 104hv of the semiconductor substrate 104, and subsequently stripping the second logic hard mask layer 3404. The second logic hard mask layer 3404 may, for example, be stripped by a wet etch in which the second logic hard mask layer 3404 is dipped in hydrofluoric (HF) solution.

As illustrated by the cross-sectional view 3700 of FIG. 37, a first ARC layer 3702 is formed covering the first logic hard mask layer 3402 and the second dummy gate layer 1006. The first ARC layer 3702 may, for example, be formed with a top surface that is planar or substantially planar.

As illustrated by the cross-sectional view 3800 of FIG. 38, a top surface of the second dummy gate layer 1006 is recessed to proximate top surfaces of the dummy control gates 504, and the first ARC layer 3702 (see FIG. 37) is removed. Further, in some embodiments, the first logic hard mask layer 3402, the inter-gate spacers 118, the common source/drain dielectric layer 1002, the second control gate hard masks 508, the control gate sidewall spacers 126, or a combination of the foregoing are also recessed. The recessing and removal may, for example, be performed by an etch, and the first logic hard mask layer 3402 may, for example, serve as an etch stop during the etch. Further, the recessing and removal may, for example, be performed as described with regard to FIG. 11.

Figure 39:
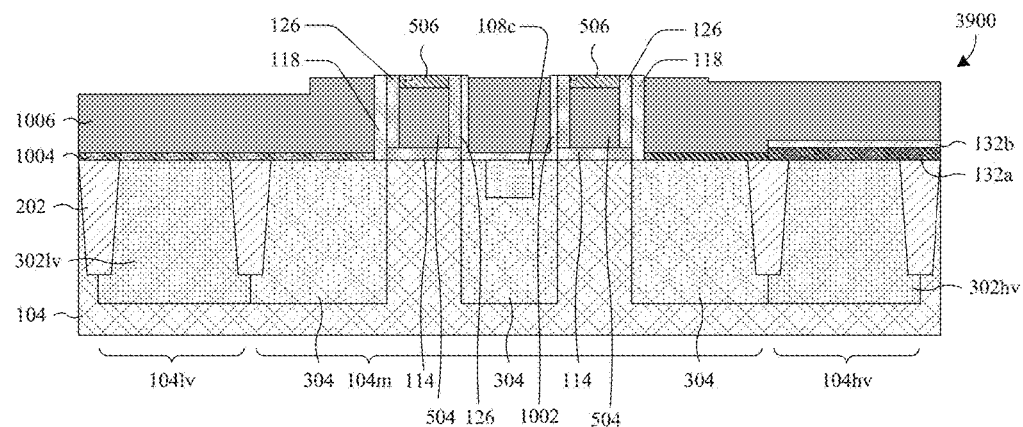

As illustrated by the cross-sectional view 3900 of FIG. 39, the first logic hard mask layer 3402 (see FIG. 38) and the second control gate hard masks 508 (see FIG. 38) are removed. Further, the control gate sidewall spacers 126, the inter-gate spacers 118, the common source/drain dielectric layer 1002, the control gate sidewall spacers 126, or a combination of the foregoing are also recessed back to proximate top surfaces respectively of the first control gate hard masks 506. Such removal and recessing may, for example, be performed by an etch.

Figure 40:
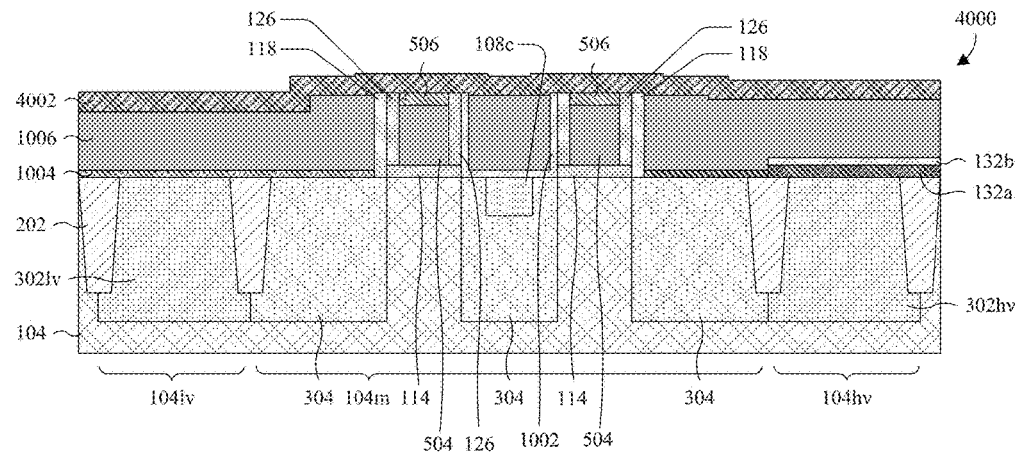

As illustrated by the cross-sectional view 4000 of FIG. 40, a dummy gate hard mask layer 4002 is formed covering the structure of FIG. 39. In some embodiments, the dummy gate hard mask layer 4002 conformally covers the structure of FIG. 39. Further, in some embodiments, the dummy gate hard mask layer 4002 is oxide or some other dielectric, and/or is formed by vapor deposition or some other deposition process.

Figure 41:
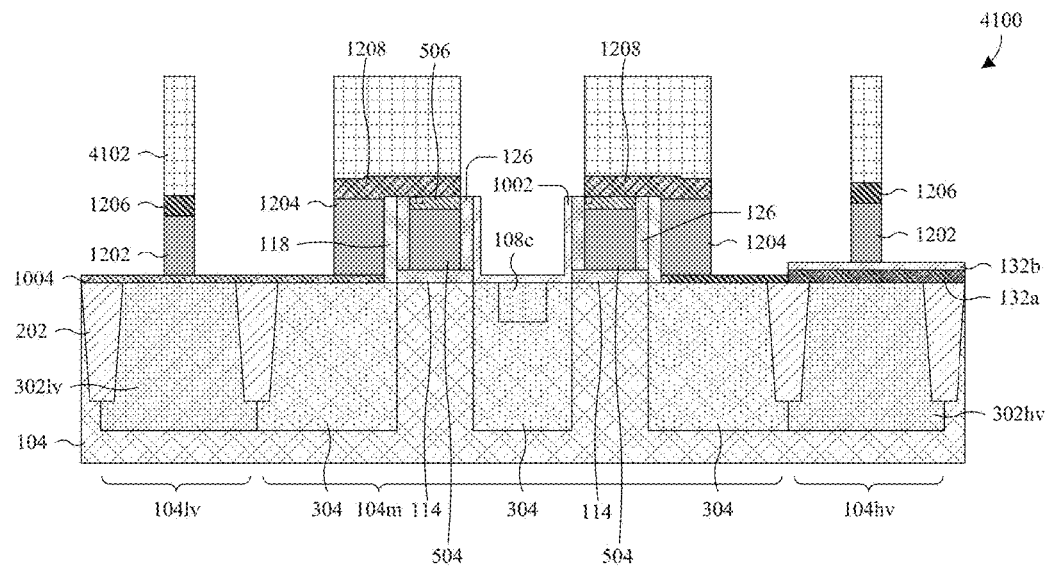

As illustrated by the cross-sectional view 4100 of FIG. 41, the dummy gate hard mask layer 4002 (see FIG. 40) is patterned to form a pair of dummy logic gate hard masks 1206 and a pair of dummy memory gate hard masks 1208. The dummy logic gate hard masks 1206 are respectively formed on the high and low voltage logic regions 104$hv$, 104$lv$ of the semiconductor substrate 104. The dummy memory gate hard masks 1208 are formed on the memory region 104$m$ of the semiconductor substrate 104, respectively overlapping the dummy control gates 504. In some embodiments, the patterning comprises an etch into the dummy gate hard mask layer 4002 while a patterned photoresist layer 4102 selectively covers the dummy gate hard mask layer 4002. The patterned photoresist layer 4102 is subsequently stripped.

Also illustrated by the cross-sectional view 4100 of FIG. 41, the second dummy gate layer 1006 (see FIG. 40) is patterned to form a pair of dummy logic gates 1202 respectively underlying the dummy logic gate hard masks 1206, and to further form a pair of dummy select gates 1204 respectively underlying the dummy memory gate hard masks 1208. In some embodiments, the second dummy gate layer 1006 is patterned by performing an etch into the second dummy gate layer 1006 while the dummy logic and memory gate hard masks 1206, 1208 selectively cover the second dummy gate layer 1006. Such an etch may be performed with or without the patterned photoresist layer 4102 in place.

Figure 42:
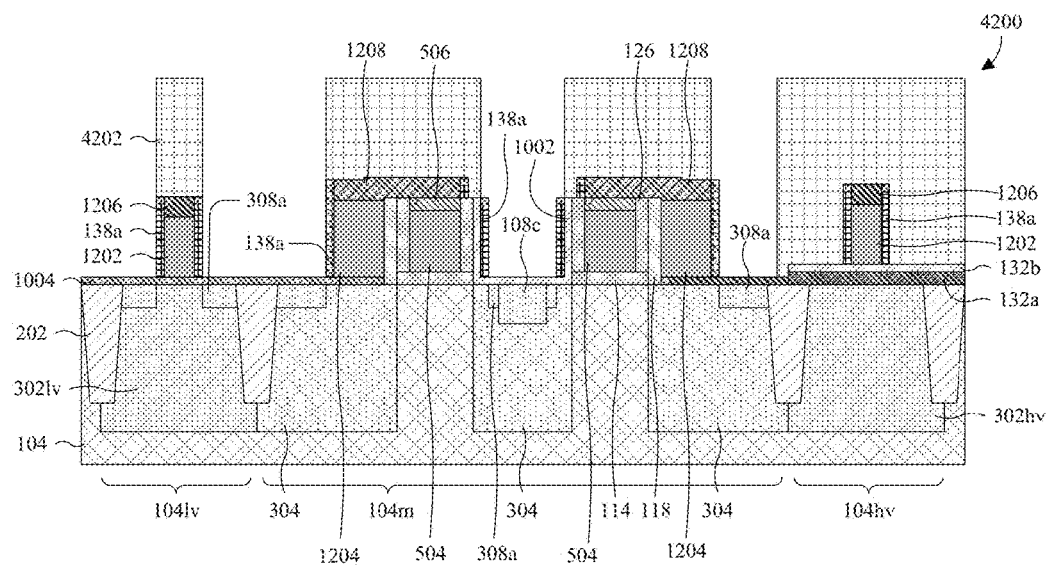

As illustrated by the cross-sectional view 4200 of FIG. 42, first main sidewall spacers 138$a$ are formed along sidewalls of the dummy logic gates 1202, the dummy select gates 1204, and the control gate sidewall spacers 126. The first main sidewall spacers 138$a$ may be, for example, oxide, nitride, or some other dielectric. Further, for ease of illustration, only some of the first main sidewall spacers 138$a$ are labeled 138$a$, and only one of the control gate sidewall spacers 126 is labeled 126. In some embodiments, a process for forming the first main sidewall spacers 138$a$ comprises forming a main sidewall spacer layer covering and conformally lining the structure of FIG. 41, and performing an etch back of the main sidewall spacer layer to remove horizontal segments of the main sidewall spacer layer without removing vertical segments of the main sidewall spacer layer. The vertical segments of the main sidewall spacer layer correspond to the first main sidewall spacers 138$a$.

Also illustrated by the cross-sectional view 4200 of FIG. 42, first LDD regions 308$a$ are formed in the low voltage logic region 104$lv$ of the semiconductor substrate 104 and the memory region 104$m$ of the semiconductor substrate 104. For ease of illustration, only some of the first LDD regions 308$a$ are labeled 308$a$. The first LDD regions 308$a$ may be formed by, for example, ion implantation while a patterned photoresist layer 4202 covers the high voltage logic region 104$hv$ of the semiconductor substrate 104, and covers dummy gates (e.g., the dummy control gates 504) in the low voltage logic region 104$lv$ of the semiconductor substrate 104 and the memory region 104$m$ of the semiconductor substrate 104. The patterned photoresist layer 4202 is subsequently removed. Alternatively, the first LDD regions 308$a$ may be formed by, for example, some other process for forming doped regions in the semiconductor substrate 104.

Figure 43:
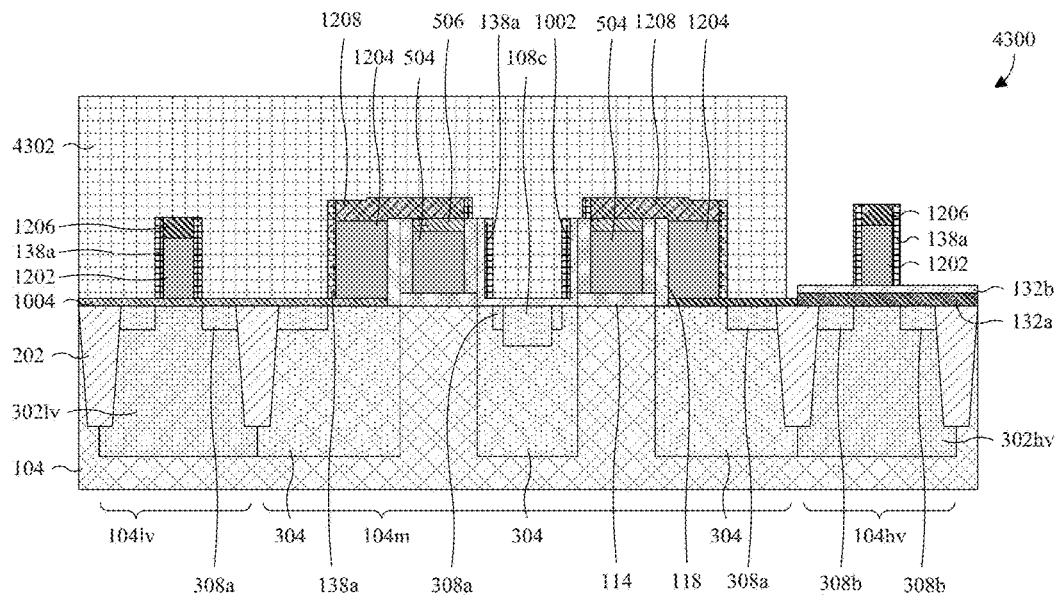

As illustrated by the cross-sectional view 4300 of FIG. 43, second LDD regions 308$b$ are formed in the high voltage logic region 104$hv$ of the semiconductor substrate 104. The second LDD regions 308$b$ may be formed by, for example, ion implantation while a patterned photoresist layer 4302 covers the low voltage logic region 104$lv$ of the semiconductor substrate 104 and the memory region 104$m$ of the semiconductor substrate 104. The patterned photoresist layer 4302 is subsequently removed. Dopants of the second LDD regions 308$b$ and/or implant energy of the ion implantation may, for example, be selected so as to implant through the high voltage gate dielectric layers 132$a$, 132$b$. Alternatively, the second LDD regions 308$b$ may be formed by, for example, some other process for forming doped regions in the semiconductor substrate 104.

Figure 44:
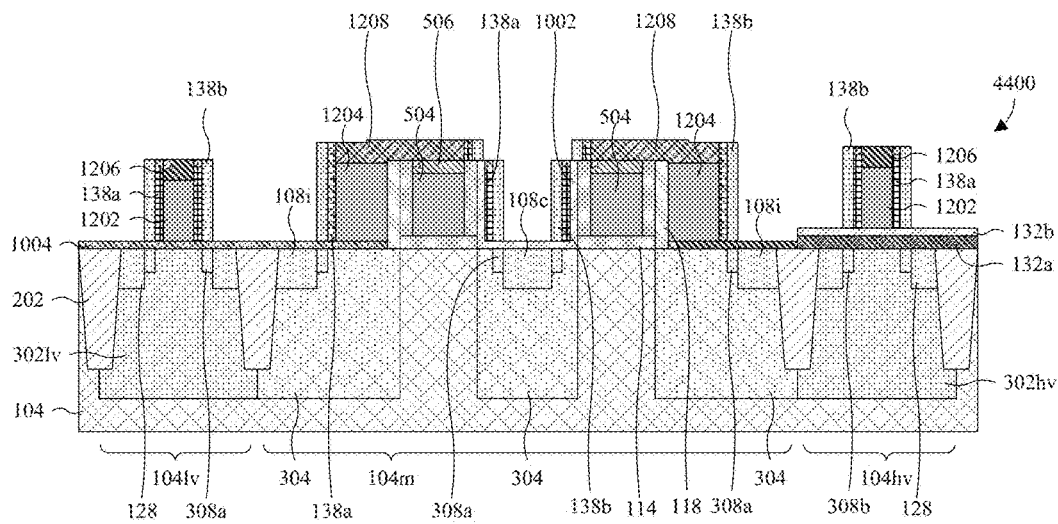

As illustrated by the cross-sectional view 4400 of FIG. 44, second main sidewall spacers 138$b$ are formed along sidewalls of the first main sidewall spacers 138$a$. For ease of illustration, only some of the second main sidewall spacers 138$b$ are labeled 138$b$, and only some of the first main sidewall spacers 138$a$ are labeled 138$a$. The second main sidewall spacers 138$b$ may, for example, be formed in the same manner described above for the first main sidewall spacers 138$a$.

Also illustrated by the cross-sectional view 4400 of FIG. 44, logic source/drain regions 128 and individual memory source/drain regions 108$i$ are formed in the semiconductor substrate 104. The logic source/drain regions 128 are formed along sidewalls of the dummy logic gates 1202. The individual memory source/drain regions 108$i$ are formed respectively bordering the dummy select gates 1204. In some embodiments, the common memory source/drain region 108$c$ may be enhanced. For example, the common memory source/drain region 108$c$ may be enhanced by enlarging the common source/drain region 108$c$ (e.g., increasing the depth and/or the width of the common source/drain region 108$c$). In other embodiments, the common memory source/drain region 108$c$ is not formed at FIG. 30 (as shown), and is instead formed at FIG. 44. The logic source/drain regions 128 and the memory source/drain regions 108$i$, 108$c$ may be formed by, for example, ion implantation, some other process for forming doped regions in the semiconductor substrate 104, or some other process for forming source/drain regions.

Figure 45:
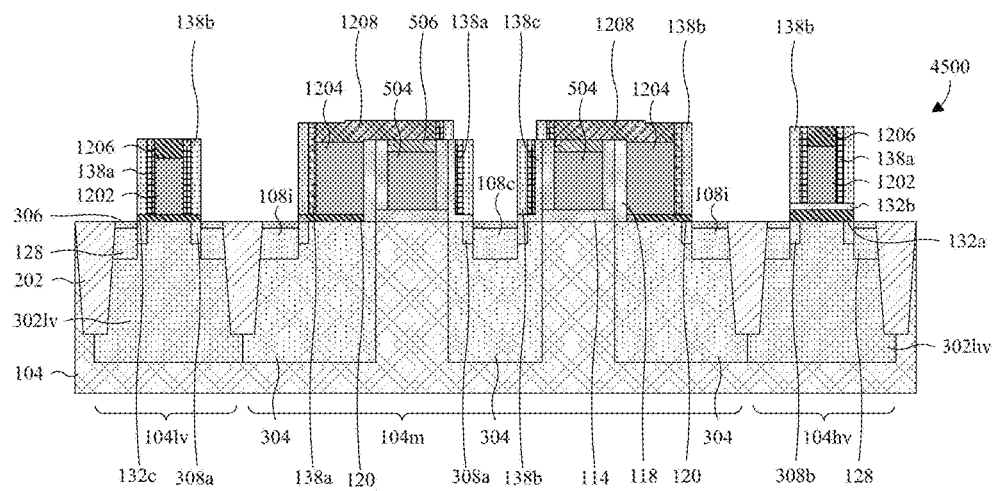

As illustrated by the cross-sectional view 4500 of FIG. 45, the common source/drain dielectric layer 1002 (see FIG. 44), the third gate dielectric layer 1004 (see FIG. 42), and the high voltage gate dielectric layers 132a, 132b are removed from the isolation structure 202, the logic source/drain regions 128, and the memory source/drain regions 108c, 108i. The removal defines a low voltage gate dielectric layer 132c underlying the dummy logic gate 1202 in the low voltage logic region 104lv of the semiconductor substrate 104. Further, the removal defines a pair of third main sidewall spacers 138c between the dummy control gates 504, as well as a pair of base select gate dielectric layers 120 underlying the dummy select gates 1204. In some embodiments, the removal is performed by performing an etch into the common source/drain dielectric layer 1002, the third gate dielectric layer 1004, and the high voltage gate dielectric layers 132a, 132b while the first and second main sidewall spacers 138a, 138b and the dummy logic and memory gate hard masks 1206, 1208 serve as a mask.

Also illustrated by the cross-sectional view 4500 of FIG. 45, a silicide layer 306 is formed on the logic source/drain regions 128 and the memory source/drain regions 108c, 108i. The silicide layer 306 may, for example, be formed of nickel silicide or some other silicide.

Figure 46:
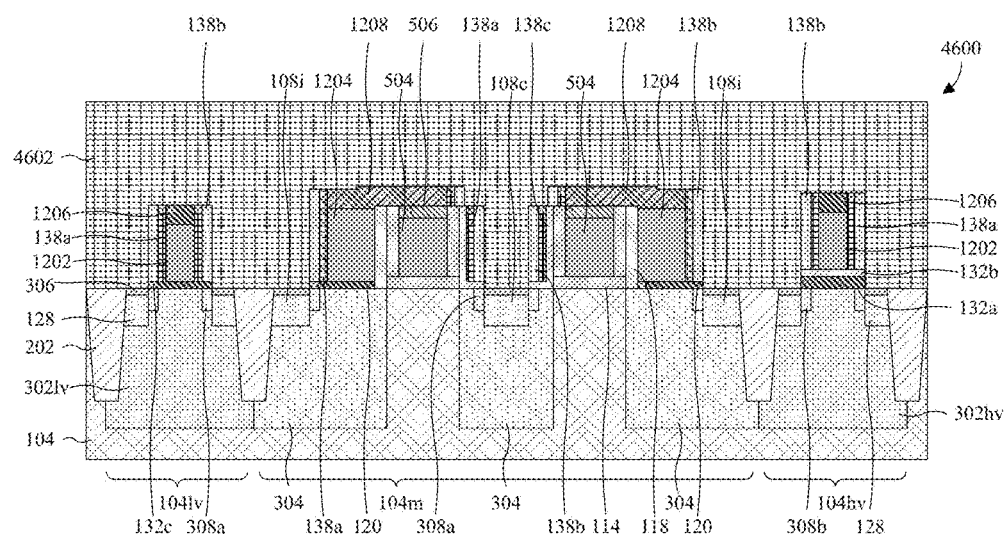

As illustrated by the cross-sectional view 4600 of FIG. 46, a second ARC layer 4602 is formed covering structure of FIG. 45. The second ARC layer 4602 may, for example, be formed with a planar or substantially planar top surface.

Figure 47:
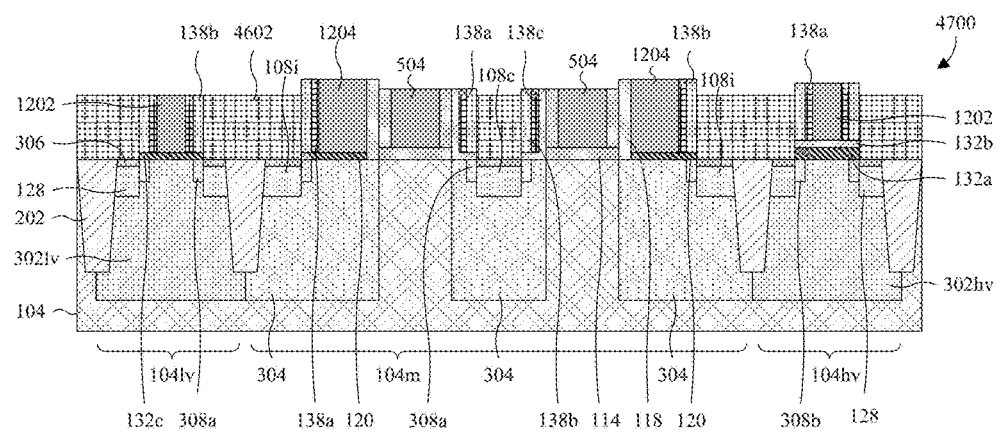

As illustrated by the cross-sectional view 4700 of FIG. 47, a top surface of the second ARC layer 4602 is recessed to proximate top surfaces of the dummy control gates 504. The recessing may, for example, be performed by an etch.

Also illustrated by the cross-sectional view 4700 of FIG. 47, the dummy logic and memory gate hard masks 1206, 1208 (see FIG. 46) are removed. Further, the first, second, and third main sidewall spacers 138a, 138b, 138c, the control gate sidewall spacers 126, and the inter-gate spacers 118 are recessed. The recessing may, for example, be to below top surfaces of the select gates 1204. The removal and recessing may, for example, be performed by an etch.

Figure 48:
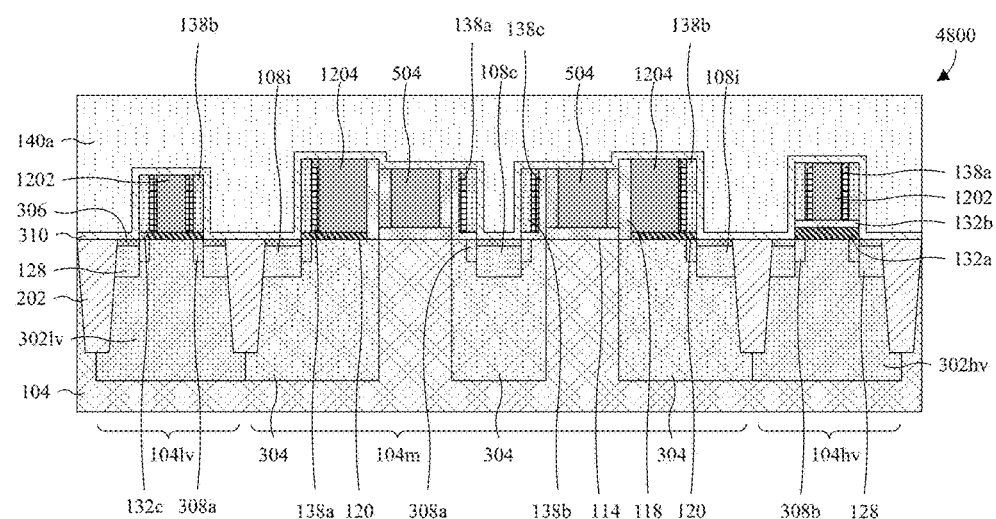

As illustrated by the cross-sectional view 4800 of FIG. 48, the second ARC layer 4602 (see FIG. 47) is removed. The removal may, for example, be performed by etching. Further, a contact etch stop layer 310 and a first ILD layer 140a are formed stacked over the semiconductor substrate 104. The contact etch stop layer 310 is formed conformally, and the first ILD layer 140a is formed covering the contact etch stop layer 310. In some embodiments, the contact etch stop layer 310 and/or the first ILD layer 140a are formed by vapor deposition, sputtering, some other deposition process, or a combination of the foregoing.

Figure 49:
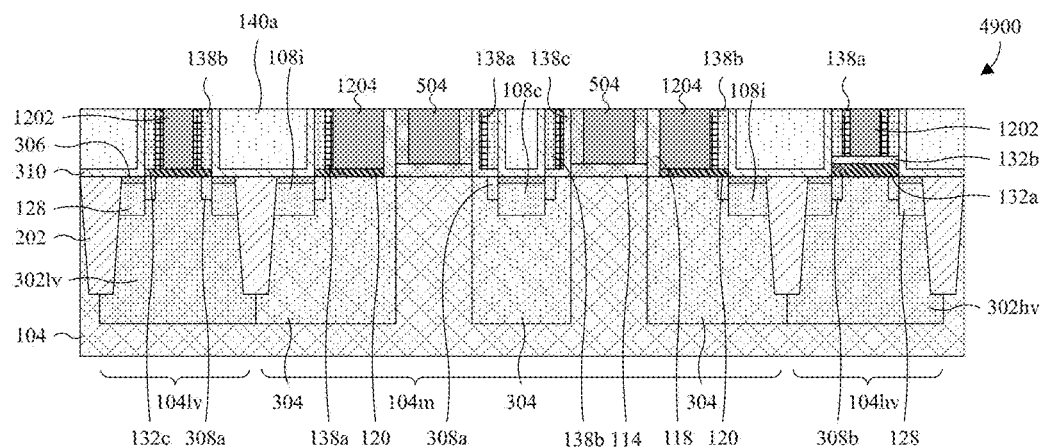

As illustrated by the cross-sectional view 4900 of FIG. 49, a planarization is performed into the contact etch stop layer 310 and the first ILD layer 140a to coplanarize top surfaces thereof with top surfaces respectively of the dummy logic gates 1202 and the dummy control and select gates 504, 1204. The planarization may, for example, be performed by CMP or some other planarization process.

Figure 50:
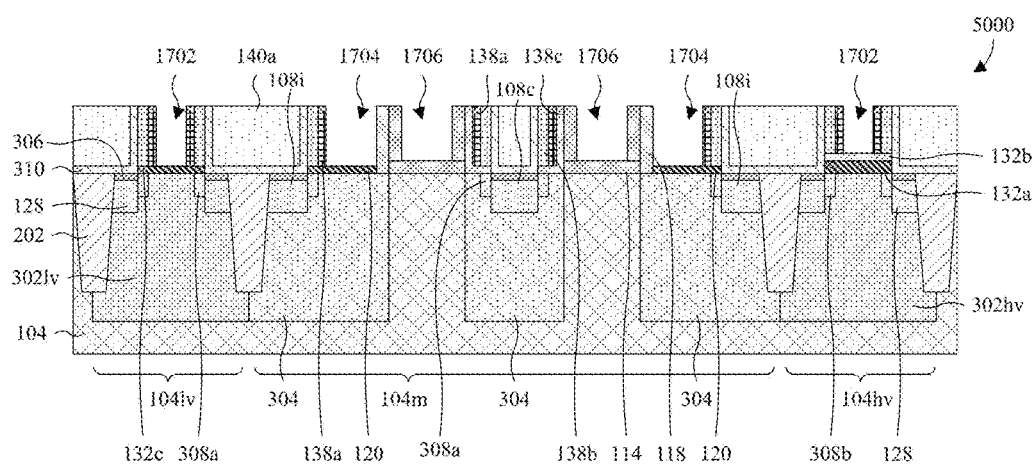

As illustrated by the cross-sectional view 5000 of FIG. 50, the dummy logic gates 1202 (see FIG. 49) and the dummy control and select gates 504, 1204 (see FIG. 49) are removed to form a pair of logic gate openings 1702, a pair of select gate openings 1704, and a pair of control gate openings 1706 respectively in place of the removed gates. Such removal may, for example, be performed by an etch into the dummy logic gates 1202 and the dummy control and select gates 504, 1004 with an etchant that is highly selective (i.e., has a high etch rate) for the gates relative to surrounding structure.

Figure 51:
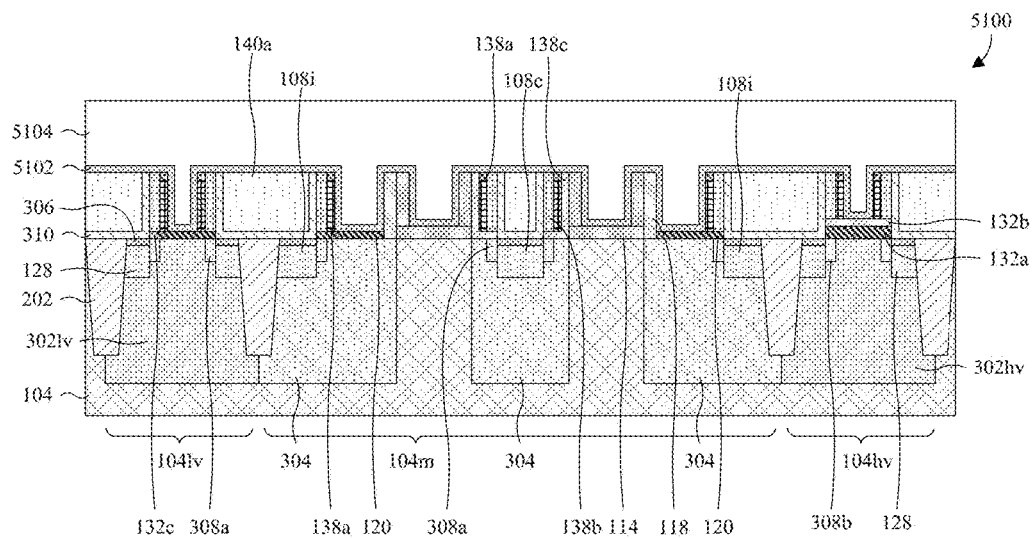

As illustrated by the cross-sectional view 5100 of FIG. 51, a high κ dielectric layer 5102 is formed conformally lining the logic, select, and control gate openings 1702, 1704, 1706, and a metal layer 5104 is formed filling the logic, select, and control gate openings 1702, 1704, 1706 over the high κ dielectric layer 1502. The high κ dielectric layer 1502 and the metal layer 1504 may, for example, be formed by vapor deposition, sputtering, some other deposition process, or a combination of the foregoing.

Figure 52:
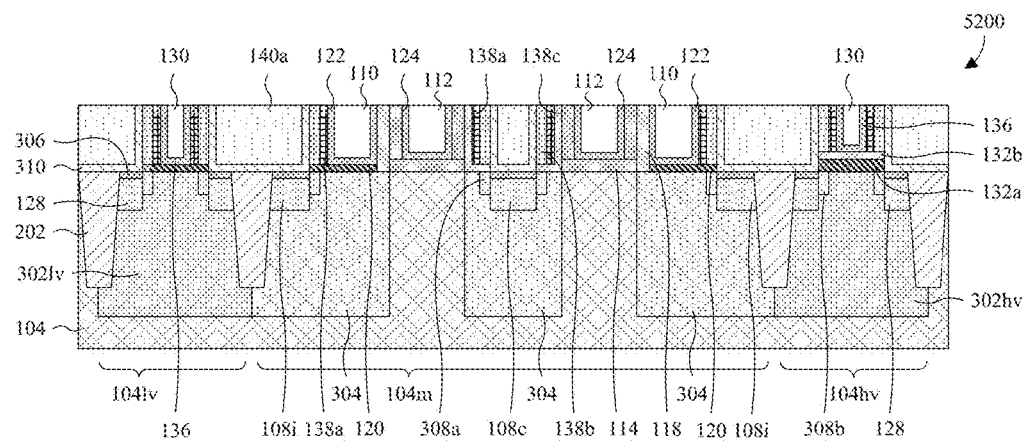

As illustrated by the cross-sectional view 5200 of FIG. 52, a planarization is performed into the high κ dielectric layer 5102 (see FIG. 51) and the metal layer 5104 (see FIG. 51) to form a logic gate 130 and a high κ logic gate dielectric layer 136 stacked in each of the logic gate openings 1702 (see FIG. 51). Further, the planarization forms a control gate 112 and a high κ control gate dielectric layer 124 stacked in each of the control gate openings 1706 (see FIG. 49). Further yet, the planarization forms a select gate 110 and a high κ select gate dielectric layer 122 stacked in each of the select gate openings 1704 (see FIG. 51). The planarization may be performed by, for example, CMP or some other planarization process.

Figure 53:
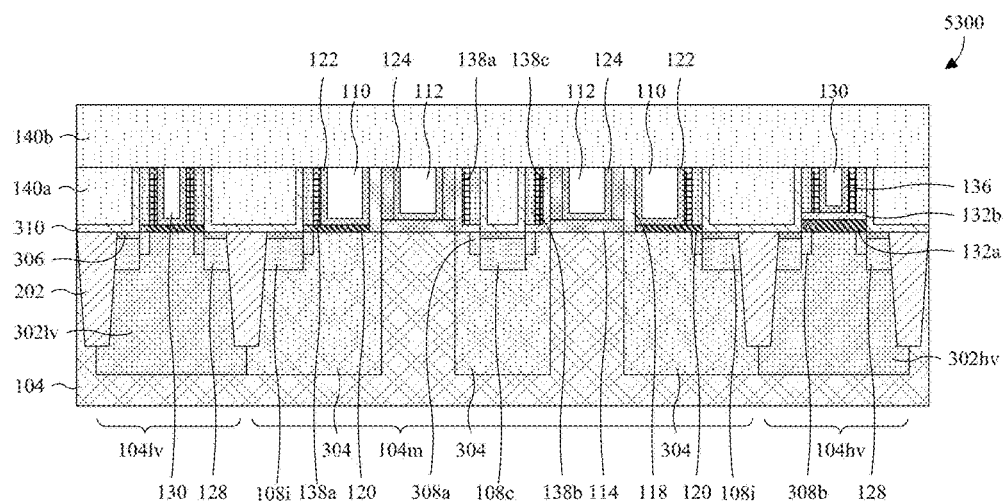

As illustrated by the cross-sectional view 5300 of FIG. 53, a second ILD layer 140b is formed covering the structure of FIG. 52. In some embodiments, the second ILD layer 140b is formed by vapor deposition, sputtering, or some other deposition process.

While FIGS. 21-53 illustrate the replacement of the dummy logic gates 1202 (see FIG. 49) and the dummy control and select gates 504, 1204 (see FIG. 49) with HKMG stacks, it is to be appreciated that the replacement may not be performed for all of the dummy gates in other embodiments. For example, the dummy select and/or control gates 1204, 504 may not be replaced with HKMG stacks. In such embodiments, the dummy gates that are not replaced are masked during gate removal at FIG. 50 and are subsequently used in production.

In view of the foregoing, some embodiments of the present application provide a method for manufacturing an IC. A gate stack is formed on a semiconductor substrate. The gate stack comprises a charge storage film and a control gate overlying the charge storage film. Further, the control gate includes a first material. A gate layer is formed covering the semiconductor substrate and the gate stack. The gate layer includes the first material. A top surface of the gate layer is recessed to below a top surface of the gate stack. The gate layer is patterned to form a select gate bordering the control gate, and to further form a logic gate spaced from the select and control gates. An ILD layer is formed laterally between the control, select, and logic gates. The ILD layer is formed with a top surface that is even with top surfaces respectively of the control, select, and logic gates. The control, select, or logic gate is replaced with a new gate. The new gate includes a second material different than the first material.

Further, other embodiments of the present application provide an IC. The IC comprises a semiconductor substrate, a memory cell, and a logic device. The memory cell is on the semiconductor substrate. Further, the memory cell comprises a pair of source/drain regions in the semiconductor substrate, and further comprises a select gate, a charge storage film, a high κ control gate dielectric layer, and a control gate. The source/drain regions define a selectively-conductive channel extending continuously from one of the source/drain regions to another one of the source/drain regions. The select gate and the charge storage film are on the selectively-conductive channel. The high κ control gate dielectric layer overlies the charge storage film. The control gate is metal and overlies the high κ control gate dielectric layer. The logic device is on the semiconductor substrate, laterally spaced from the memory cell. Further, the logic device comprises a logic gate.

Further yet, other embodiments of the present application provide another method for manufacturing an IC. A pair of gate stacks is formed on a memory region of a semiconductor substrate. The gate stacks each comprise an ONO charge storage film and a polysilicon control gate overlying the ONO charge storage film. A polysilicon gate layer is formed covering and conformally lining the semiconductor substrate and the gate stacks. An ARC layer is formed covering the polysilicon gate layer. The ARC layer and the polysilicon gate layer are simultaneously etched until the ARC layer has been removed and a top surface of the polysilicon gate layer has been recessed to below top surfaces of the gate stacks. The gate layer is patterned to form a pair of polysilicon select gates on the memory region of the semiconductor substrate, respectively bordering the polysilicon control gates of the gate stacks. Further, the gate layer is patterned to further form a polysilicon logic gate on a logic region of the semiconductor substrate that is spaced from the memory region of the semiconductor substrate. An ILD layer is formed laterally between the polysilicon control, select, and logic gates. The ILD layer is formed with a top surface that is even with top surfaces respectively of the polysilicon control, select, and logic gates. The polysilicon control, select, and logic gates replaced respectively with HKMG stacks, each comprising a high κ dielectric layer and a metal gate overlying the high κ dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an integrated circuit (IC), the method comprising:
    forming a gate stack on a semiconductor substrate, wherein the gate stack comprises a charge storage film and a control gate overlying the charge storage film, and wherein the control gate includes a first material;
    forming a gate layer covering the semiconductor substrate and the gate stack, wherein the gate layer includes the first material;
    recessing a top surface of the gate layer to below a top surface of the gate stack;
    patterning the gate layer to form a select gate, and to further form a logic gate spaced from the select and control gates;
    forming an interlayer dielectric (ILD) layer laterally between the control, select, and logic gates, wherein the ILD layer is formed with a top surface that is even with top surfaces respectively of the control, select, and logic gates; and
    replacing the control, select, or logic gate with a new gate, wherein the new gate includes a second material different than the first material.

2. The method according to claim 1, further comprising:
    replacing the control, select, and logic gates respectively with new gates, wherein the new gates include the second material.

3. The method according to claim 1, wherein the first material includes polysilicon, and wherein the second material includes metal.

4. The method according to claim 1, wherein the charge storage film includes an oxide-nitride-oxide (ONO) film.

5. The method according to claim 1, wherein the recessing comprises:
    forming an anti reflective coating (ARC) layer covering the gate layer; and
    simultaneously etching the ARC layer and the gate layer until the top surface of the gate layer has been recessed to the control gate and the ARC layer has been removed.

6. The method according to claim 5, wherein the recessing further comprises:
    forming a logic hard mask on the gate layer, wherein the logic hard mask covers a logic region of the semiconductor substrate on which the logic gate is formed, wherein the select and control gates are formed on a memory region of the semiconductor substrate that is laterally spaced from the logic region, wherein the ARC layer is formed covering the logic hard mask, and wherein the simultaneous etching stops on the logic hard mask.

7. The method according to claim 1, wherein the patterning of the gate layer comprises:
    forming a dummy gate hard mask layer covering the gate layer; and
    performing an etch into the dummy gate hard mask layer and the gate layer to form the select and logic gates, and to further form a logic gate hard mask and a memory gate hard mask, wherein the logic gate hard mask overlies the logic gate, and wherein the memory gate hard mask overlies the control and select gates.

8. The method according to claim 1, wherein the replacing replaces the control, select, or logic gate with both the new gate and a high κ dielectric layer underlying the new gate.

9. The method according to claim 1, wherein the replacing comprises:
    performing an etch into the control, select, or logic gate to remove the control, select, or logic gate, and to form an opening in place of the control, select, or logic gate;
    forming a high κ dielectric layer along a bottom surface of the opening;
    forming a metal layer filling the opening over the high κ dielectric layer; and
    performing a planarization into the metal layer to the top surface of the ILD layer, such that the new gate is formed in the opening and from the metal layer.

10. An integrated circuit (IC) comprising:
    a semiconductor substrate;
    a memory cell on the semiconductor substrate, wherein the memory cell comprises a pair of source/drain regions in the semiconductor substrate, and further comprises a select gate, a charge storage film, a high κ control gate dielectric layer, and a control gate, wherein the source/drain regions define a selectively-conductive channel extending continuously from one of the source/drain regions to another one of the source/drain regions, wherein the select gate and the charge storage film are on the selectively-conductive channel, wherein the high κ control gate dielectric layer overlies the charge storage film and has a U-shaped cross section, and wherein the control gate is metal and overlies the high κ control gate dielectric layer; and a logic device on the semiconductor substrate, laterally spaced from the memory cell, wherein the logic device comprises a logic gate.

11. The IC according to claim 10, wherein the charge storage film includes an oxide-nitride-oxide (ONO) film.

12. The IC according to claim 10, wherein the memory cell further comprises a high κ select gate dielectric layer, wherein the select gate overlies the high κ select gate dielectric layer, and wherein the select gate is metal.

13. The IC according to claim 10, wherein the memory cell further comprises:
   a pair of control gate sidewall spacers respectively on opposite sides of the control gate, wherein the control gate sidewall spacers both directly overlie the charge storage film; and
   an inter-gate spacer between the select gate and the control gate sidewall spacers, wherein the inter-gate spacer laterally and directly contacts both the charge storage film and one of the control gate sidewall spacers.

14. The IC according to claim 13, wherein the memory cell further comprises a high κ select gate dielectric layer, wherein the select gate overlies and contacts the high κ select gate dielectric layer, and where the inter-gate spacer laterally contacts the high κ select gate dielectric layer.

15. The IC according to claim 13, wherein the control gate sidewall spacers laterally contact the high κ control gate dielectric layer, and wherein the inter-gate spacer laterally contacts the select gate.

16. The IC according to claim 10, further comprising a second memory cell on the semiconductor substrate, laterally spaced from the logic device and the memory cell, wherein the second memory cell comprises a second pair of source/drain regions in the semiconductor substrate, and further comprises a second select gate, a second charge storage film, and a second control gate, wherein the source/drain regions of the second pair define a second selectively-conductive channel extending continuously respectively from and to the source/drain regions of the second pair, wherein the second select gate and the second charge storage film are on the second selectively-conductive channel, and wherein the second control gate overlies the second charge storage film.

17. A method for manufacturing an integrated circuit (IC), the method comprising:
   forming a pair of gate stacks on a memory region of a semiconductor substrate, wherein the gate stacks each comprise an oxide-nitride-oxide (ONO) charge storage film and a polysilicon control gate overlying the ONO charge storage film;
   forming a polysilicon gate layer covering and conformally lining the semiconductor substrate and the gate stacks;
   forming an antireflective coating (ARC) layer covering the polysilicon gate layer;
   simultaneously etching the ARC layer and the polysilicon gate layer until the ARC layer has been removed and a top surface of the polysilicon gate layer has been recessed to below top surfaces of the gate stacks;
   patterning the gate layer to form a pair of polysilicon select gates on the memory region of the semiconductor substrate, respectively bordering the polysilicon control gates of the gate stacks, and to further form a polysilicon logic gate on a logic region of the semiconductor substrate that is spaced from the memory region of the semiconductor substrate;
   forming an interlayer dielectric (ILD) layer laterally between the polysilicon control, select, and logic gates, wherein the ILD layer is formed with a top surface that is even with top surfaces respectively of the polysilicon control, select, and logic gates; and
   replacing the polysilicon control, select, and logic gates respectively with high-κ-metal-gate (HKMG) stacks, each comprising a high κ dielectric layer and a metal gate overlying the high κ dielectric layer.

18. The method according to claim 17, further comprising:
   forming a first gate dielectric layer covering and conformally lining the semiconductor substrate and the gate stacks;
   removing the first gate dielectric layer from a central region between the gate stacks without removing the first gate dielectric layer outside the central region;
   forming a second gate dielectric layer covering and conformally lining the semiconductor substrate and the gate stacks over the first gate dielectric layer;
   removing the first gate dielectric layer from the memory region of the semiconductor substrate without removing the first gate dielectric layer from the logic region of the semiconductor substrate; and
   removing the second gate dielectric layer from a periphery of the memory region of the semiconductor substrate without removing the second gate dielectric layer from the central region and the logic region of the semiconductor substrate;
   wherein the polysilicon logic gate is formed on the first and second gate dielectric layers.

19. The IC according to claim 10, wherein the charge storage film is dielectric and directly contacts the high κ control gate dielectric layer, wherein the IC further comprises a high κ select gate dielectric layer having a U-shaped profile and cupping an underside of the select gate, and wherein a bottommost surface of the high κ select gate dielectric layer is spaced over the semiconductor substrate.

20. The IC according to claim 10, wherein the control gate is laterally between the select gate and a first source/drain region of the pair, and wherein the first source/drain region is uncovered by a gate electrode when viewed in cross section.

* * * * *